US012603247B2

(12) United States Patent
Nguyen

(10) Patent No.: US 12,603,247 B2
(45) Date of Patent: Apr. 14, 2026

(54) TRANSITION CONTROL IN A BIAS SUPPLY

(71) Applicant: Advanced Energy Industries, Inc.,
Denver, CO (US)

(72) Inventor: Hien Minh Nguyen, Longmont, CO
(US)

(73) Assignee: Advanced Energy Industries, Inc.,
Denver, CO (US)

( * ) Notice: Subject to any disclaimer, the term of this
patent is extended or adjusted under 35
U.S.C. 154(b) by 0 days.

(21) Appl. No.: 18/656,543

(22) Filed: May 6, 2024

(65) Prior Publication Data

US 2024/0429023 A1 Dec. 26, 2024

Related U.S. Application Data

(63) Continuation of application No. 17/901,759, filed on
Sep. 1, 2022, now Pat. No. 11,978,613.

(51) Int. Cl.
H03K 3/017 (2006.01)
H01J 37/32 (2006.01)
(52) U.S. Cl.
CPC ........ H01J 37/32146 (2013.01); H03K 3/017
(2013.01); H01J 2237/334 (2013.01)
(58) Field of Classification Search
CPC ....................................................... H03K 3/017
USPC ....................................................... 327/530
See application file for complete search history.

(56) References Cited

U.S. PATENT DOCUMENTS

| | | | |
|---|---|---|---|
| 9,667,211 B1 | 5/2017 | Wyse et al. | |
| 11,670,487 B1 | 6/2023 | Nguyen | |

| | | | |
|---|---|---|---|
| 11,875,972 B2 | 1/2024 | Driessen | |
| 11,887,812 B2 | 1/2024 | Nguyen et al. | |
| 11,942,309 B2 | 3/2024 | Singh | |
| 11,978,613 B2 | 5/2024 | Nguyen | |
| 12,009,179 B2 | 6/2024 | Nguyen | |
| 12,046,448 B2 | 7/2024 | Singh et al. | |
| 12,125,674 B2 | 10/2024 | Carter | |
| 2014/0117872 A1 | 5/2014 | Finley | |
| 2015/0222181 A1 | 8/2015 | Coleman | |

(Continued)

FOREIGN PATENT DOCUMENTS

| | | |
|---|---|---|
| CN | 206272512 U | 6/2017 |
| DE | 19912981 C1 | 12/2000 |

(Continued)

OTHER PUBLICATIONS

EPO, Extended European Search Report issued in Application No.
21803110.2, Jun. 6, 2024, pp. 11.

(Continued)

*Primary Examiner* — Tomi Skibinski
(74) *Attorney, Agent, or Firm* — NOD Law PC

(57) ABSTRACT

Bias supplies and bias control methods are disclosed. One
method comprises applying an asymmetric periodic voltage
waveform and providing a corresponding current waveform
at an output node relative to a return node; receiving a signal
to change from a current state of the asymmetric periodic
voltage waveform to a next state of the asymmetric periodic
voltage waveform; and adjusting, during a transition from
the current state to the next state, at least one portion of the
asymmetric periodic voltage waveform and simultaneously
adjusting a fundamental frequency of the asymmetric peri-
odic voltage waveform to settle at the next state.

17 Claims, 35 Drawing Sheets

(56) References Cited

U.S. PATENT DOCUMENTS

| | | | |
|---|---|---|---|
| 2017/0256381 A1 | 9/2017 | Denpoh | |
| 2017/0345620 A1 | 11/2017 | Coumou et al. | |
| 2017/0358431 A1 | 12/2017 | Dorf et al. | |
| 2018/0166249 A1 | 6/2018 | Dorf et al. | |
| 2018/0233321 A1 | 8/2018 | Caron | |
| 2018/0342903 A1* | 11/2018 | Luu ................... | H01J 37/32091 |
| 2020/0111644 A1 | 4/2020 | Long et al. | |
| 2020/0135527 A1 | 4/2020 | Sung et al. | |
| 2021/0118649 A1 | 4/2021 | Huh et al. | |
| 2022/0037122 A1 | 2/2022 | Bowman et al. | |
| 2022/0116033 A1 | 4/2022 | Miller et al. | |
| 2022/0270856 A1 | 8/2022 | Poulose et al. | |
| 2022/0285131 A1 | 9/2022 | Shaw et al. | |
| 2022/0384149 A1 | 12/2022 | Shi et al. | |
| 2022/0415615 A1 | 12/2022 | Cubaynes et al. | |
| 2023/0050119 A1 | 2/2023 | Martinez et al. | |
| 2023/0050841 A1 | 2/2023 | Nguyen | |
| 2023/0238216 A1 | 7/2023 | Singh et al. | |
| 2023/0253187 A1 | 8/2023 | Singh | |
| 2023/0343556 A1 | 10/2023 | Nguyen | |
| 2023/0395354 A1 | 12/2023 | Shaw et al. | |
| 2024/0030001 A1 | 1/2024 | Nguyen et al. | |
| 2024/0079210 A1 | 3/2024 | Nguyen | |
| 2024/0194452 A1 | 6/2024 | Singh | |
| 2024/0242945 A1 | 7/2024 | Nguyen et al. | |
| 2024/0304419 A1 | 9/2024 | Nguyen | |

FOREIGN PATENT DOCUMENTS

| | | | |
|---|---|---|---|
| JP | 4016325 | B2 | 12/2007 |
| JP | 2019-523993 | A | 8/2019 |
| JP | 2021-503701 | A | 2/2021 |
| KR | 1020110016486 | A | 2/2011 |
| TW | 201009879 | A | 3/2010 |
| WO | 2010008006 | A1 | 1/2010 |

OTHER PUBLICATIONS

JPO, Notice of Reasons for Rejection issued in Application No. 2022-501232, May 29, 2024, 10 pages, Published in JP.

Perez, Bryan Reynaldo, Final Office Action issued in U.S. Appl. No. 16/871,613, filed Apr. 4, 2024, 119 pages, Published in US.

Perez, Bryan Reynaldo, Office Action issued in U.S. Appl. No. 16/871,613, filed Nov. 3, 2023, 147 pages, Published in: US.

TIPO, Office Action issued in TW Application No. 109123604, Jun. 24, 2024, 26 pages, Published in TW.

Yu, Yuechuan, Office Action issued in U.S. Appl. No. 18/318,861, filed Mar. 20, 2024, 51 pages, Published in US.

Japan Patent Office, Notice of Reasons for Rejection issued in JP Application No. 2022-568414, Oct. 10, 2024.

PCT, International Preliminary Report on Patentability issued in PCT/US2022/053703, Aug. 8, 2024, 7 pages.

PCT, International Preliminary Report on Patentability issued in PCT/US2022/053706, Aug. 8, 2024, 8 pages.

PCT, International Preliminary Report on Patentability issued in PCT/US2022/053709, Aug. 8, 2024, 7 pages.

PCT, International Search Report and Written Opinion issued in PCT/US2024/011334, Jun. 21, 2024, 16 pages.

Yu, Yuechuan, Final Office Action issued in U.S. Appl. No. 18/318,861, filed Nov. 12, 2024, 95 pages.

Ferdous, Zannatul, Office action issued in U.S. Appl. No. 18/350,516, filed Mar. 20, 2025, 133 pages.

KIPO, Notice of Grounds for Rejection issued in Korean Patent Application No. 10-2022-7004812, Mar. 12, 2025, 15 pages.

PCT, International Preliminary Report on Patentability issued in PCT/US2023/073153, Mar. 13, 2025, 9 pages.

PCT, International Search Report and Written Opinion issued in PCT/US2024/055362, Jan. 14, 2025, 18 pages.

Yu, Yuechuan, Office Action issued in U.S. Appl. No. 18/318,861, Feb. 20, 2025, 102 pages.

Ford, Nathan K, Office Action issued in U.S. Appl. No. 17/401,422, filed Apr. 24, 2025, 100 pages.

PCT, International Search Report and Written Opinion issued in PCT/US2025/017119, Apr. 29, 2025, 20 pages.

Diop et al., 10 kV SiC MOSFET Evaluation for Dielectric Barrier Discharge Transformerless Power Supply, Aug. 18, 2020, Plasma, vol. 3, No. 3, pp. 103-116.

EPO, Extended European Search Report issued in EP Application No. 22856600.6, May 12, 2025, 9 pages.

KIPO, Notice of Grounds for Rejection issued in KR Application No. 10-2022-7042658, Jul. 10, 2025, 26 pages.

Rueda et al., Series Resonant Inverter Efficiency Improvement with Valley Switching for Dielectric Barrier Discharges, IEEE 2019 IEEE 13th International Conference Onpower Electronics and Drive Systems, Toulouse, France, Jul. 9-12, 2019, 6 pages.

Final Office Action received for U.S. Appl. No. 18/350,516, mailed on Aug. 7, 2025, 29 pages.

Final Office Action received for U.S. Appl. No. 18/670,168 dated Sep. 11, 2025, 6 pages.

International Preliminary Report on Patentability received for PCT Patent Application No. PCT/US2024/011334, mailed on Jul. 24, 2025, 7 pages.

International Search Report and Written Opinion received for PCT Patent Application No. PCT/US2025/040171, mailed on Oct. 8, 2025, 17 pages.

Non-Final Office Action received for U.S. Appl. No. 18/518,840 mailed on Sep. 23, 2025, 9 pages.

Non-Final Office Action received for U.S. Appl. No. 18/670,168 dated Aug. 29, 2025, 5 pages.

Notice of Allowance received for JP Patent Application Serial No. 2022-568414, dated Jul. 29, 2025, 4 pages.

Office Action received for European Application No. 24742051.6, mailed on Aug. 20, 2025, 3 pages.

Office Action received for Japanse Patent Application No. 2024-215046, mailed on Jun. 26, 2025, 3 pages (2 pages of original office action and 1 page of English Translation).

* cited by examiner

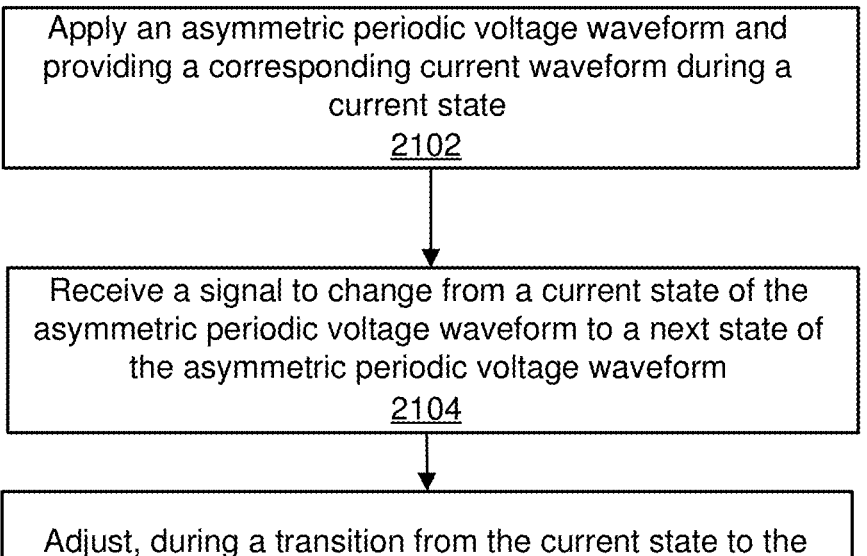

Apply an asymmetric periodic voltage waveform and providing a corresponding current waveform during a current state
2102

Receive a signal to change from a current state of the asymmetric periodic voltage waveform to a next state of the asymmetric periodic voltage waveform
2104

Adjust, during a transition from the current state to the next state, at least one of the first, second, and third portions of the asymmetric periodic voltage waveform and simultaneously adjust a fundamental frequency of the asymmetric periodic voltage waveform to settle at the next state, wherein the fundamental frequency during the transition is different than the fundamental frequency during either the current or next state
2106

FIG. 21

Exponentially-decaying current curve $$i_b = I_2 + (I_1 - I_2)e^{-t/\tau}$$

$I_2$ $I_1$ $I_b$ trajectory $V_b$ trajectory

Linear current ramp $I_2$ $I_1$ $I_b$ trajectory $V_b$ trajectory

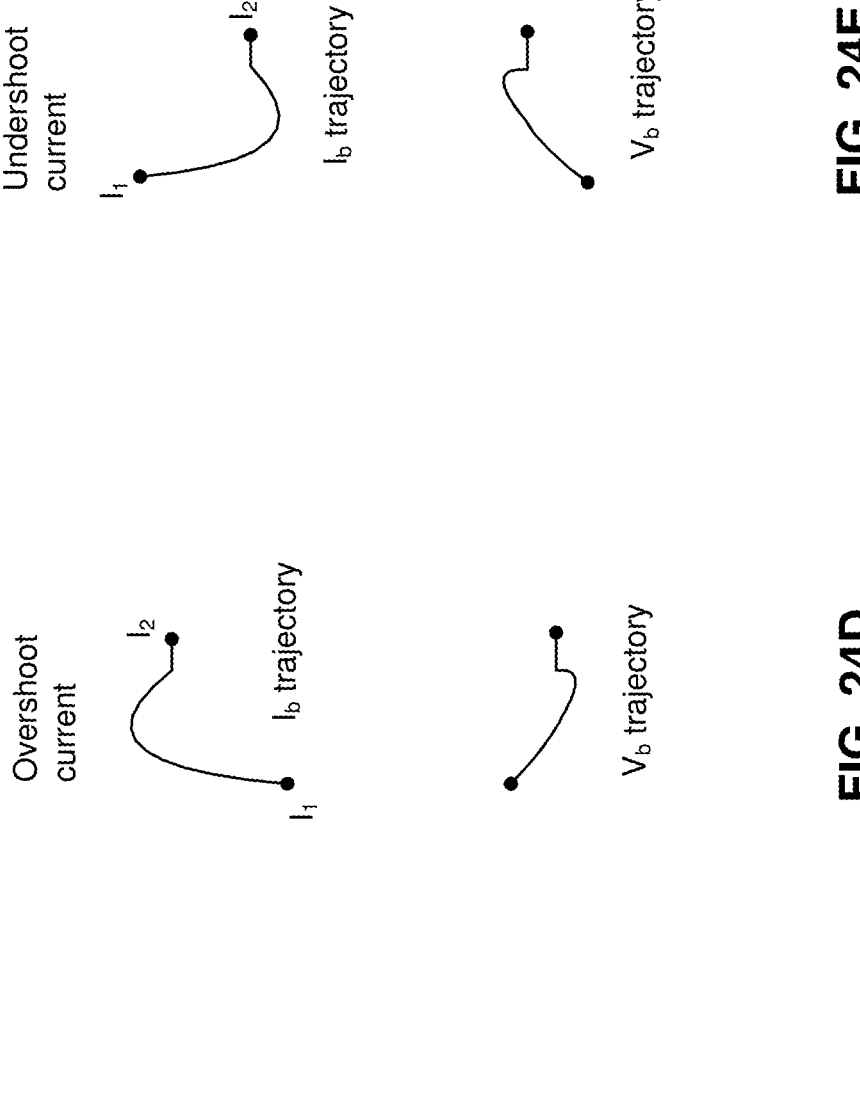
FIG. 24C
FIG. 24D
FIG. 24E
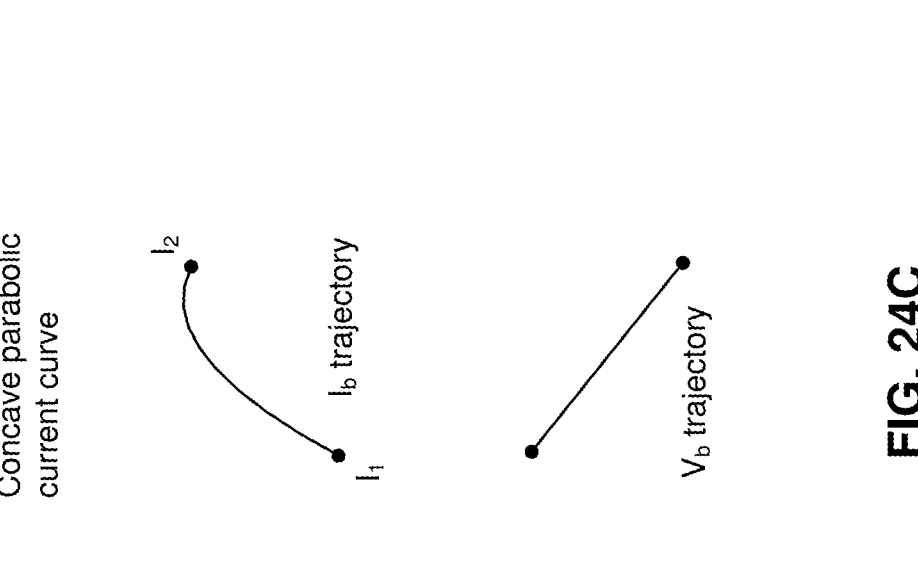

| Transition | PWM period | Number of PWM cycles |
|---|---|---|
| State 0 to 1 | T_01 | N_01 |
| | T_02 | N_02 |
| | ... | ... |
| | T_0m | N_0m |
| State 1 to 2 | T_11 | N_11 |
| | T_12 | N_12 |
| | ... | ... |
| | T_1m | N_1m |
| ... | | |
| State (n-1) to n | | |
| State n to 0 | | |

FIG. 31

Vstep Transition Control – PID Compensator Method

TRANSITION CONTROL IN A BIAS SUPPLY

BACKGROUND

Field

The present invention relates generally to power supplies, and more specifically to power supplies for applying a voltage for plasma processing.

Background

Many types of semiconductor devices are fabricated using plasma-based etching techniques. If it is a conductor that is etched, a negative voltage with respect to ground may be applied to the conductive substrate to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an alternating current (AC) voltage (e.g., high frequency AC or time varying periodic voltage waveform may be applied by a bias supply to the conductive plate (or chuck) so that the AC field induces a voltage on the surface of the substrate. During a negative portion of the applied waveform, the surface of the substrate will be charged negatively, which causes ions to be attracted toward the negatively-charged surface during the negative portion of the periodic cycle. And when the ions impact the surface of the substrate, the impact dislodges material from the surface of the substrate-effectuating the etching.

During operation of a bias supply, the bias supply undergoes state changes such as from an off state to an on state. In addition, the periodic waveform may by changed, consistent with state changes, to effectuate different ion energy distribution functions (IEDFs). For example, on directionality, feature profile, and selectivity to a mask and a stop-layer may be controlled by making state changed to the bias supply to adjust the IEDF.

In recent years, advanced plasma processing systems have turned to using pulsed plasmas for several reasons. In one instance, pulsing is used to reduce the average energy imparted to a wafer. For example, to achieve a desired etch rate or depth of an etched feature, high powers, such as ten or more kilowatts of bias power, may be used. Unfortunately, continuous application of such high power might damage the wafer or process hardware, so pulsing of a source supply is used to reduce average power delivered by reducing the duty cycle. In another instance, pulsing is used to control the electron temperature in the plasma. The operational state of a bias supply may be synchronized with pulsing of a source supply so that the bias supply undergoes state changes that are synchronized with state changes of the source supply.

SUMMARY

An aspect may be characterized as bias supply that includes an output node, a return node, and a switch network and at least one power supply coupled to the output node and the return node. The switch network and the at least one power supply are configured, in combination, to apply an asymmetric periodic voltage waveform and provide a corresponding current waveform at the output node relative to the return node. The bias supply also comprises a metrology component configured to receive and sample voltage and current signals indicative of the periodic voltage waveform. A controller is configured to control the switch network and at least one power supply, wherein the controller comprises a transition control module configured to receive a signal to change from a current state to a next state and adjust, during a transition from the current state to the next state, a voltage of the at least one power supply and simultaneously control a switching frequency of the switch network to adjust a fundamental frequency of the asymmetric periodic voltage waveform to settle at the next state after a defined transition.

Yet another aspect may be characterized as a method for applying a periodic voltage. The method includes applying an asymmetric periodic voltage waveform and providing a corresponding current waveform at an output node relative to a return node; receiving a signal to change from a current state of the asymmetric periodic voltage waveform to a next state of the asymmetric periodic voltage waveform; and adjusting, during a transition from the current state to the next state, at least one of the first, second, and third portions of the asymmetric periodic voltage waveform and simultaneously adjusting a fundamental frequency of the asymmetric periodic voltage waveform to settle at the next state, wherein the fundamental frequency during the transition is different than the fundamental frequency during either the current or next state.

BRIEF DESCRIPTION OF THE DRAWINGS

FIG. 21 is a flowchart depicting a method for controlling a bias supply;

FIGS. 24A, 24B, 24C, 24D, and 24E depict examples of inductor currents and voltages for various transition types;

FIG. 31 is an example lookup table that may be used in connection with the method described with reference to FIG. 30 and other methods;

DETAILED DESCRIPTION

Figure 1:
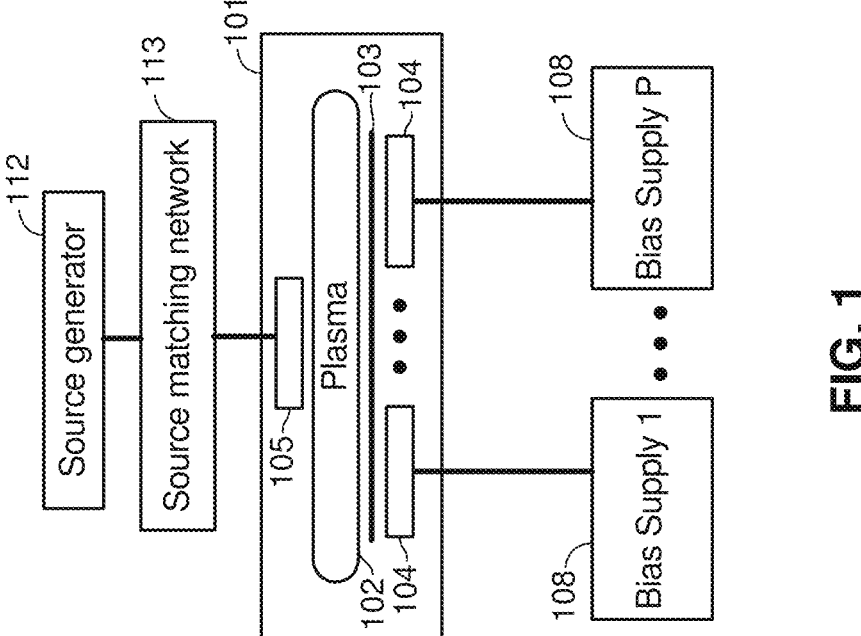
FIG. 1 is a block diagram depicting an exemplary plasma processing environment in which bias supplies disclosed herein may be utilized.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments. In this regard, some blocks in these flowcharts or block diagrams may represent a module, segment, or portion of code, which comprises one or more executable instructions for implementing the specified logical function(s). The instructions may be executable by a processor or may be used to program a field programmable gate array. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

For the purposes of this disclosure, source generators or excitation supplies are those whose energy is primarily directed to generating and sustaining the plasma, while "bias supplies" are those whose energy is primarily directed to generating a surface potential for attracting ions and electrons from the plasma.

Applicant has found that when bias supplies undergo state changes, the periodic voltage waveform and/or current waveform output by the bias supply may have undesirable oscillations that may result in an undesirable and/or unintended IEDF. In addition, the oscillations may result in slower than desired settling time for a bias supply. An aspect of the present disclosure is control, during a transition between one operational state of a bias supply to another operational state of the bias supply, over a fundamental frequency of the periodic voltage waveform applied by the bias supply to mitigate against these undesirable oscillations. Applicant has also found that specific control over the fundamental frequency may result in a faster change from one state of the periodic voltage waveform to another state of the periodic voltage waveform. The state changes that the bias supply undergoes may or may not be in the context of a pulsed plasma. And the transition control may simply be between an off state and an on state of a bias supply or transition control (over the fundamental frequency) may occur on an ongoing bias while applying state changes to effectuate a specific recipe that is applied to a workpiece (also referred to herein as a substrate).

Also described herein are control aspects of bias supplies that may be used to apply a periodic voltage function to a substrate support in a plasma processing chamber. Referring first to FIG. 1, shown is an exemplary plasma processing environment (e.g., deposition or etch system) in which bias supplies may be utilized. The plasma processing environment may include many pieces of equipment coupled directly and indirectly to a plasma processing chamber 101, within which a volume containing a plasma 102 and workpiece 103 (e.g., a wafer) and electrodes 104 (which may be embedded in a substrate support) are contained. The equipment may include vacuum handling and gas delivery equipment (not shown), one or more bias supplies 108, one or more source generators 112, and one or more source matching networks 113. In many applications, power from a single source generator 112 is connected to one or multiple source electrodes 105. The source generator 112 may be a higher frequency RF generator (e.g., 13.56 MHz to 120 MHz). The electrode 105 generically represents what may be implemented with an inductively coupled plasma (ICP) source, a dual capacitively-coupled plasma source (CCP) having a secondary top electrode biased at another RF frequency, a helicon plasma source, a microwave plasma source, a magnetron, or some other independently operated source of plasma energy.

In variations of the system depicted in FIG. 1, the source generator 112 and source matching network 113 may be replaced by, or augmented with, a remote plasma source. And other variations of the system may include only a single bias supply 108. It should be recognized that many other variations of the plasma processing environment depicted in FIG. 1 may be utilized. As examples without limitation, U.S. Pat. No. 10,707,055, issued Jul. 7, 2020 and U.S. Pat. No. 10,811,227, issued Oct. 20, 2020, both of which are incorporated by reference in their entirety, disclose various types of system designs.

It should also be recognized that, while the following disclosure generally refers to plasma-based wafer processing, implementations can include any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to affect a surface change, subsurface change, deposition or removal by physical or chemical means.

Figure 2:
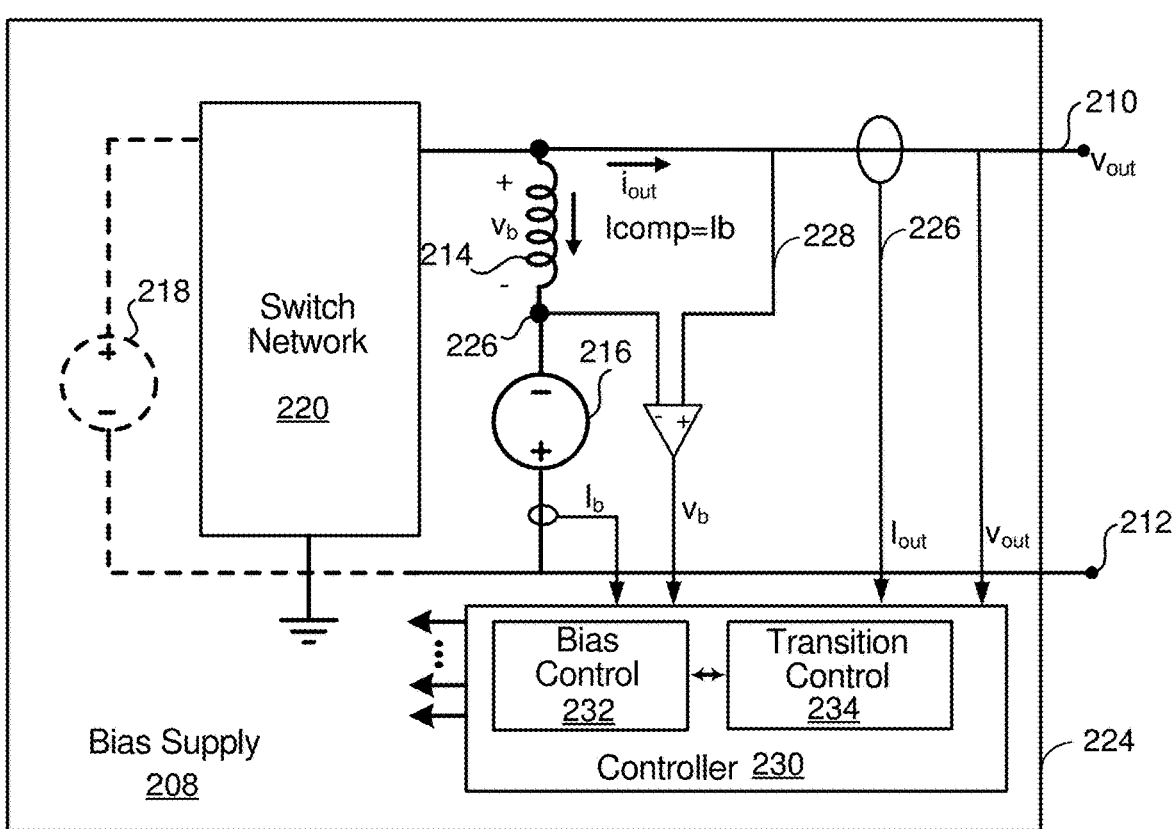
FIG. 2 is a schematic diagram depicting an exemplary bias supply.

Referring to FIG. 2, shown is an exemplary bias supply 208 that may be utilized to implement the bias supplies 108 described with reference to FIG. 1. The bias supply 208 generally represents many variations of bias supplies described further herein to apply a periodic voltage function. Thus, reference to the bias supply 208 generally refers to any of the bias supplies described further herein. As shown, the bias supply 208 includes an output 210 (also referred to as an output node 210), a return node 212, a switch network 220, and a series combination of an inductance 214 and a first power supply 216 (also referred to herein as Vsupply) that is coupled between the output node 210 and the return node 212. Also shown is an optional second power supply 218 (also referred to herein as Vrail). In general, the bias supply 208 functions to apply an asymmetric periodic voltage function between the output node 210 and the return node 212. Current delivered to a load through the output node 210 is returned to the bias supply 208 through the return node 212 that may be common with the load.

FIG. 2 also depicts examples of electrical parameters that are associated with the bias supply 208 including an inductor voltage, Vb, that is a voltage across the inductance 214, which may be measured as the voltage between the output node 210 and a negative node 226 of the first power supply 216. In addition, inductance current, Ib, that flows through the inductance 214 may be measured along the current path that includes the inductance 214 and the first power supply 216. Yet another electrical parameter that may be measured is output current, Iout, which may be measured along a current path, as shown, between the switch network and the output node 210. In addition the output voltage, Vout, is another electrical parameter that may be measured and utilized as described herein. Vout, for example, may be the voltage across the output node 210 and the return node. As described herein, the return node 212 may be grounded in some variations of the bias supply 208 or may be another non-zero voltage. It should be recognized that other electrical parameters of the bias supply 208 may be monitored and/or measured depending upon the particular design of the bias supply 208.

As shown, the bias supply 208 may include a controller that functions to control the first power supply 216, the second power supply 218, and the switch network 220 based upon one or more of the electrical parameters (e.g., Ib, Vb, Iout, and Vout). The controller 230 may reside within a housing 224 of the bias supply 208, or alternatively, may reside external to the housing 222 of the bias supply 208. When implemented external to the housing 222 of the power supply 208, the controller 230 may be implemented as a portion of a centralized controller that controls several pieces of processing equipment such as, for example and without limitation, the bias supply 208, the source generator 112, the source matching network 113, other bias supplies 108, mass flow controllers, and other components. The controller 230 may also be distributed between the bias supply 208 and control-related components that are external to the bias supply 208. It is also contemplated that the controller 230 may be implemented within a housing of another piece of equipment such as the source generator 112 or the controller 230 may be implemented as a distributed controller that resides in several pieces of equipment.

As shown, the controller 230 comprises a bias control portion 232 and a transition control module 234. The depiction of the bias control portion 232 and the transition control module 234 is logical for purposes of describing functional aspects of the controller 230, but is should be recognized that the bias control portion 232 and the transition control module 234 may be realized by common hardware constructs. For example, the bias control portion 232 and the transition control module 234 may share one or more common processors and/or field programmable gate arrays (FPGAs). As one of ordinary skill in the art will appreciate, processor executable instructions and/or instructions to program an FPGA may be utilized to effectuate control methods described further herein.

In general, the bias control portion 232 is configured to control the switch network 220, the first power supply 216, and the second power supply 218 (when the second power supply is utilized) to effectuate desired aspects of the periodic voltage waveform (as described further herein) that is applied to the output node 210 and the return node 212. The transition control module 234 generally operates, as described further herein, in connection with the bias control portion 232 to modify operation of the bias control portion 232 during transitions between control states so that a fundamental frequency of the asymmetrical voltage waveform, during a transition, is different than either a state before the transition and different than a state after the transition. As described further herein, the adjustment to the fundamental frequency during transitions mitigates against undesirable effects and/or is useful to achieve desirable effects.

Variations of the switch network 220 (and variations with and without the second power supply 218) are disclosed further herein, but first, it is helpful to understand aspects of a plasma load.

Figure 3:
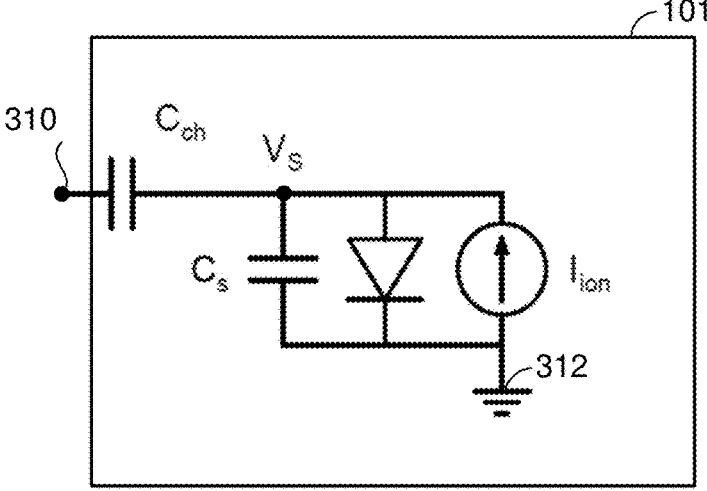
FIG. 3 is a schematic diagram electrically representing aspects of a plasma processing chamber.

Referring briefly to FIG. 3, shown is a schematic drawing that electrically depicts aspects of an exemplary plasma load within the plasma processing chamber 101. As shown, the plasma processing chamber 101 may be represented by a chuck capacitance $C_{ch}$ (that includes a capacitance of a chuck and workpiece 103) that is positioned between an input 310 (also referred to as an input node 310) to the plasma processing chamber 101 and a node representing a sheath voltage, Vs, at a surface of the workpiece 103 (also referred to as a wafer substrate 103). As a consequence, references to the sheath voltage, Vs, are also referred to herein as a voltage at a surface of the wafer or substrate. In addition, a return node 312 (which may be a connection to ground) is depicted. The plasma 102 in the processing chamber is represented by a parallel combination of a sheath capacitance $C_s$, a diode, and a current source. The diode represents the non-linear, diode-like nature of the plasma sheath that results in rectification of the applied AC field, such that a direct-current (DC) voltage drop, appears between the workpiece 103 and the plasma 102.

Figure 4:
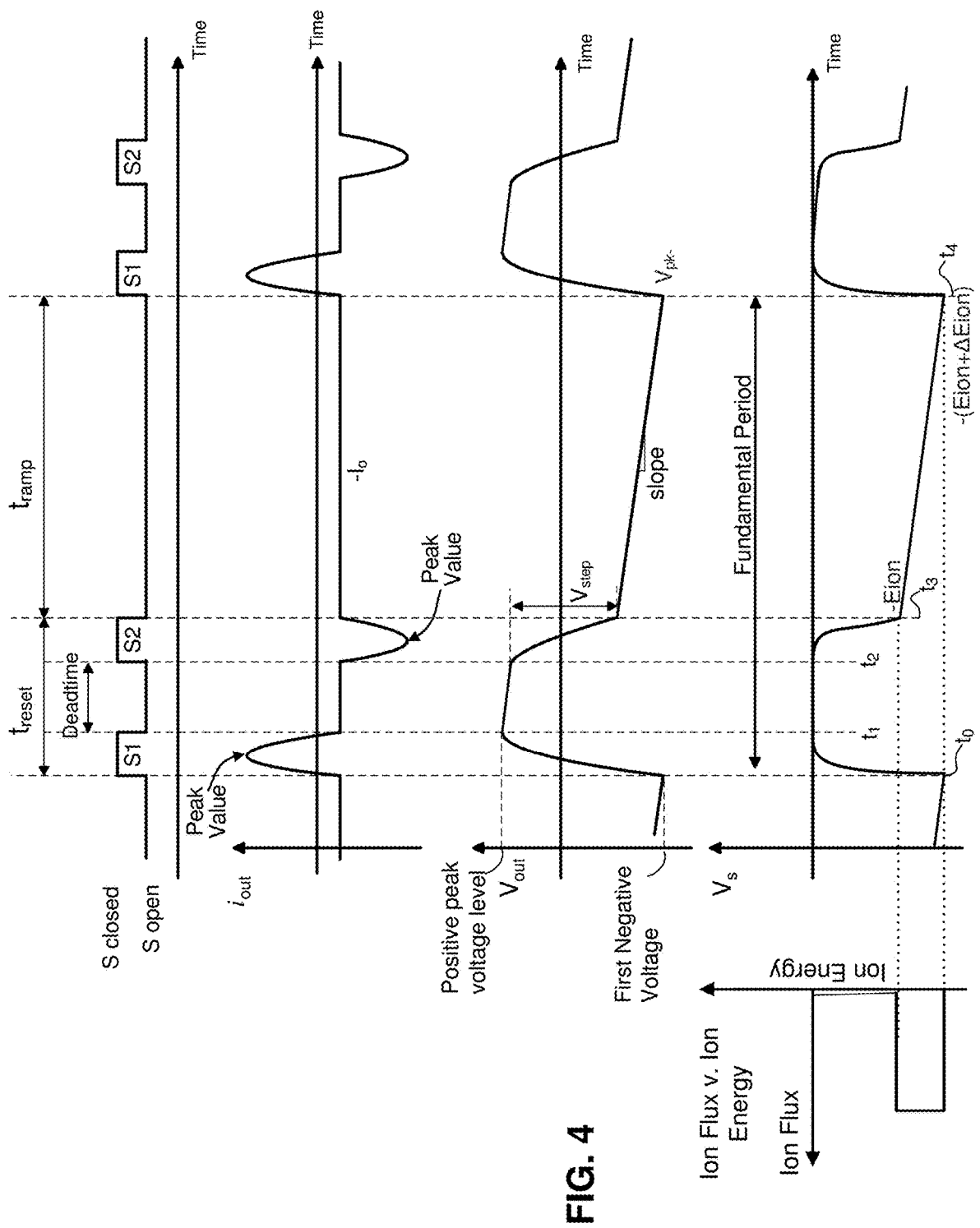
FIG. 4 depicts graphs and a timing diagram depicting aspects of a bias supply that comprises two switches.
Figure 5:
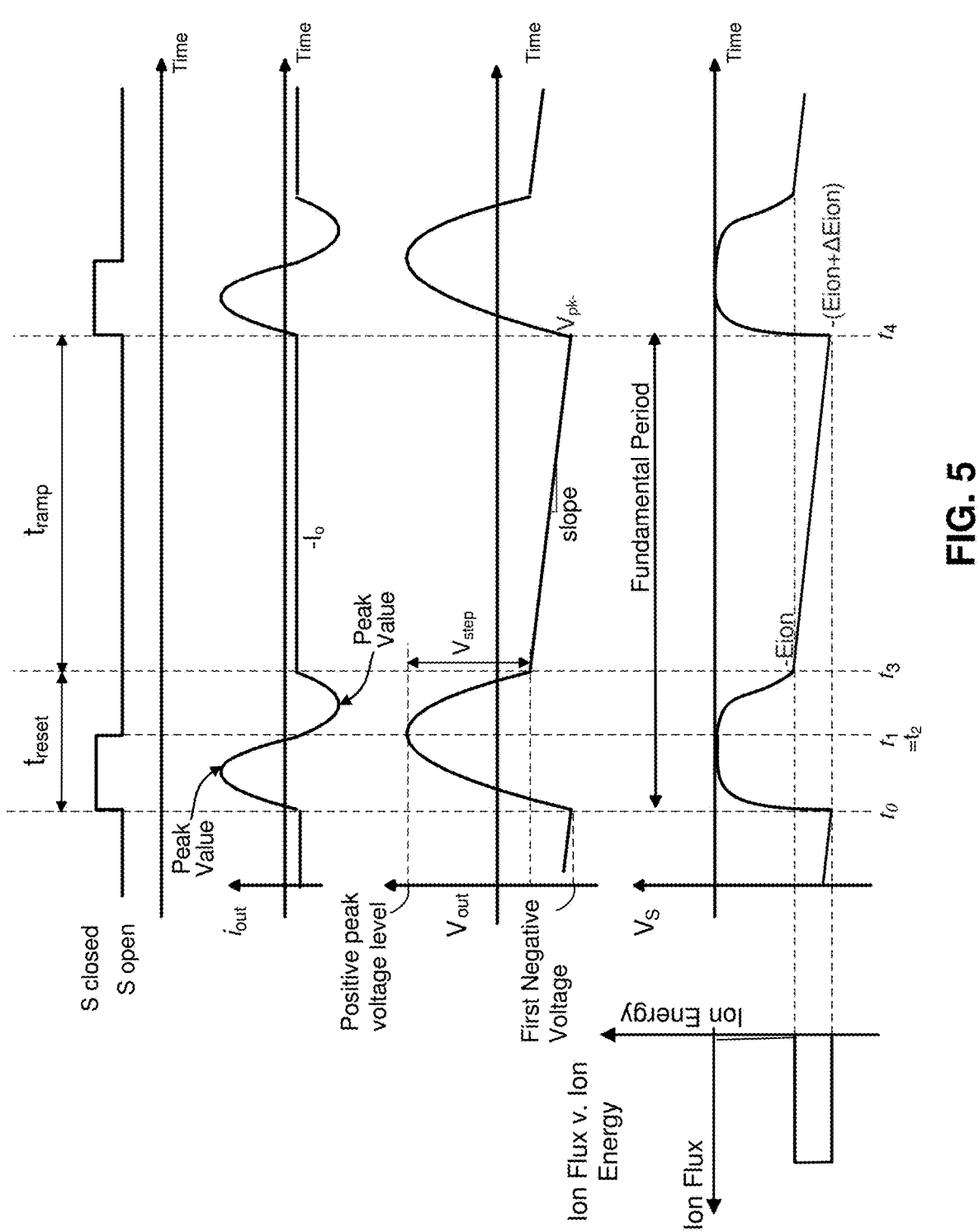
FIG. 5 depicts graphs and a timing diagram depicting aspects of a bias supply that comprises a single switch.

Referring next to FIGS. 4 and 5, shown are timing diagrams associated with implementations of the bias supplies 208 that have two switches and one switch, respectively. In each of FIGS. 4 and 5 shown are an asymmetric periodic voltage waveform and provide a corresponding current waveform. As depicted, the bias supplies 208 disclosed herein operate to apply an asymmetric periodic voltage waveform, Vo, (from time t0 to t4) between the output node 210 and the return node 212. As shown, the asymmetric periodic voltage waveform, Vo, comprises a first portion (from time t0 to t2) that begins with a first negative voltage and changes to a positive peak voltage (at time t1) during the first portion, the asymmetric periodic voltage also changes from the first portion to a third voltage level (at time t3) during a second portion (from time t2 to t3), and the asymmetric periodic voltage waveform comprises a third portion (from time t3 to t4) that includes a voltage ramp between the third voltage level and a fourth, negative voltage level (at time t4).

As shown in FIGS. 4 and 5, the asymmetric periodic voltage waveform comprises a voltage step, Vstep, between times t2 and t3, and Vstep corresponds to a sheath voltage at t3 that produces ions at any energy level, −Eion. And during the third portion of the asymmetric periodic voltage waveform, the sheath voltage may become more negative so that at t4, ions at an energy level of Eion+ΔEion are produced. Also shown in FIGS. 4 and 5 are times treset (between times t0 and t3) and tramp (between times t3 and t4). As shown, treset covers a time that includes both the first and second portions of the asymmetric periodic voltage waveform, and tramp includes the third portion. Also shown in FIGS. 4 and 5 are examples of the compensation current referenced in FIG. 2. Compensation current, Icomp, may be provided throughout the application of the asymmetric periodic voltage function, and Iout may or may not equal Icomp during the third portion of the asymmetric periodic voltage waveform (during tramp). Also shown in FIGS. 4 and 5 are a negative voltage peak, Vpk−, which identifies an end to the third portion of the asymmetric periodic voltage function. As described further herein, the negative voltage peak, Vpk− may be used as a control parameter. For example, a threshold value for the negative voltage peak, Vpk− may trigger the closing of S1 (as shown in FIG. 4) or the single switch that is controlled with reference to FIG. 5.

As discussed further herein, a fundamental period (from t0 to t4) of the asymmetric periodic voltage waveform may be adjusted to adjust a spread of ion energies. As shown in FIGS. 4 and 5, a full current cycle occurs between times t0 and t3 during the first and second portions of the asymmetric periodic voltage waveform. And the time between full current cycles is the time, tramp, between t3 and t4. An aspect of the present disclosure addresses the problem of how to adjust the current, Iout, to compensate for the ion current Iion. Another aspect of the present disclosure addresses the problem of how to adjust a level of ion energies and distribution of the ion energies in the plasma chamber.

As shown in FIG. 4, in variations of the bias supplies, 208 that comprise two switches, the first portion of the asymmetric periodic voltage waveform may transition (during the time between time $t_1$ to $t_2$) to the second portion of the asymmetric periodic voltage waveform. And as shown in FIG. 5, in variations of the bias supplies 208 that comprise one switch, t1 may equal t2 and the first portion of the asymmetric periodic voltage waveform may end (and the second portion may start) at a positive peak voltage level.

Further details of both single-switch and two-switch bias supplies are disclosed further herein, but FIGS. 4 and 5 provide a reference for the variations control methodologies and the various structural variations disclosed further herein.

Shown in FIG. 4 are a switching sequence of a first switch, S1, and a second switch, S2; current, $I_{out}$, provided at the output node 210 of the bias supply 208; voltage, Vout, at the output node 210 of the bias supply 208; and the sheath voltage, Vs (also shown in FIG. 3); and a corresponding ion energy distribution function (IEDF) depicted as ion flux versus ion energy.

As shown in FIG. 4. the first switch, S1, and the second switch, S2, may be controlled so that output current, $I_{out}$, completes a full current cycle between times to and t3. During a start of a current cycle at $t_0$, the output current, $I_{out}$, is controlled from a level $-I_o$, to reach a positive peak current value, and then the current is controlled to fall back to $-I_o$, at $t_1$. Then, at $t_2$, the output current, Iout, is controlled from $-I_o$, to increase, to a peak value in an opposite direction (opposite from the positive peak current value) before decreasing back to $-I_o$ at $t_3$. More specifically, during the positive portion of the current cycle (when the first switch, S1, is closed and the second switch, S2, is open), the current increases to a peak positive value then decreases to $-I_o$. During a negative portion (from time $t_2$ to $t_3$) of the full current cycle, the current increases to a negative value peak value then decreases to $-I_o$.

As shown, in FIG. 4, the first switch, S1, and the second switch, S2, may be controlled with an adjustable deadtime, which is the time from $t_1$ to $t_2$ (after the switch, S1, is opened from a closed position and before S2 is closed).

As depicted in FIG. 4, control the deadtime enables control over $t_{reset}$, and adjusting a ratio of $t_{reset}$ to $t_{ramp}$ adjusts average power. And control over $t_{reset}$ enables the fundamental switching frequency to be controlled (e.g., to remain below a level that affects plasma density in the plasma processing chamber 101).

Another aspect of control that may be achieved with the bias supply 208 disclosed herein is ion current compensation. More specifically, the length of the deadtime, the length of $t_{ramp}$, and/or the period of the periodic voltage function (between t0 and t4) may be controlled to control a level of ion current compensation. In FIG. 4, $t_{ramp}$, the deadtime, and/or the level, $I_o$, may be controlled (if desired) so that ion current, $I_{ion}$, is compensated to a point where $I_o=I_{ion}-(Cch+Cstr1)*slope$ and $I_{comp}=I_{ion}-(Cch+Cstr0+Cstr1)*slope$ where slope is the slope of the output voltage, Vout, from t3 to t4.

As shown in FIG. 4, when overcompensating for ion current, the sheath voltage Vs (and the voltage at the surface of the workpiece 103) becomes increasingly negative between times t3 and t4 (during the $t_{ramp}$ time frame). And due to the range of sheath voltages between t3 and t4, there is a distribution of ion energies. It should be recognized, however, that ion current may be undercompensated so that the sheath voltage Vs (and the voltage at the surface of the workpiece 103) becomes less negative between times t3 and t4 (during the $t_{ramp}$ time frame).

It is also possible to adjust the slope of the bias output voltage, Vout, between t3 and t4 so that the sheath voltage, Vs, is substantially constant between t3 and t4, which results in a very narrow distribution of ion energy.

By adjusting both deadtime and $t_{ramp}$, the frequency of the periodic voltage waveform may be fixed if desired, but it is also possible to vary the deadtime, $t_{ramp}$, and the frequency of the periodic voltage waveform. It is also contemplated that the deadtime may be shortened while shortening or lengthening $t_{ramp}$.

Referring to FIG. 5, shown are waveforms depicting electrical aspects of the bias supply 208 and plasma processing chamber 101 when the switch network 220 is implemented with a single switch, as shown in FIG. 5, the switch network may be controlled so that output current, $I_{out}$, completes a full cycle from $-I_o$ to a peak value, back to $-I_o$, to a peak value in an opposite direction and back to $-I_o$. It should be recognized the peak value of the current in a first half of the current cycle may be different than the peak value of the current in the second half of the current cycle.

Figure 6:
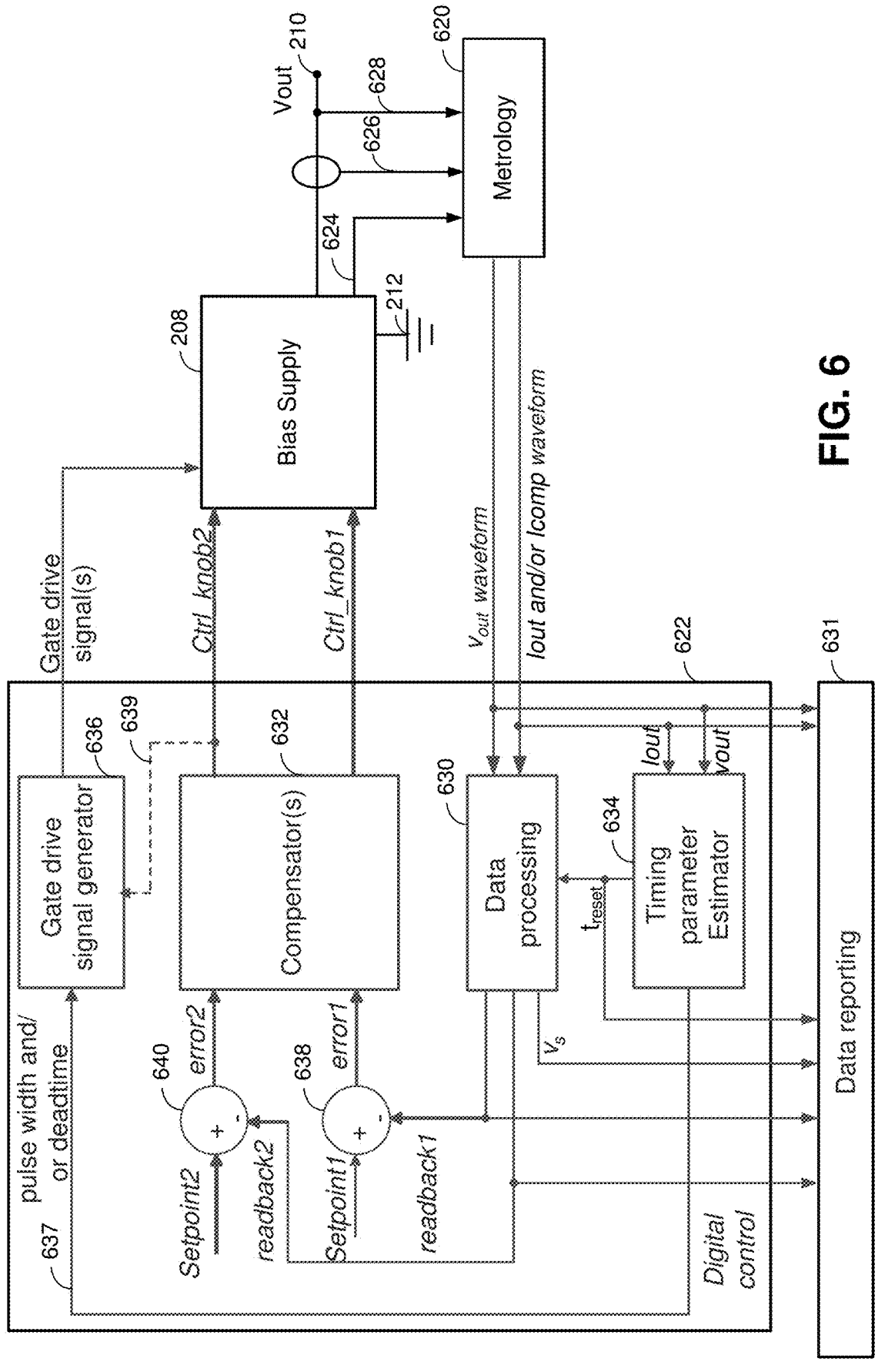
FIG. 6 is a block diagram depicting aspects of sampling, readback, and control of a bias supply.

Referring next to FIG. 6, shown is a block diagram depicting general aspects of metrology, readback and control. Shown are the bias supply 208, a metrology component 620 and a digital control section 622. In general, the metrology component 620 receives and samples signals indicative of power-related parameter values and provides a digital representation of the power-related parameter values to the digital control section 622. For example, the power-related parameters may be current provided to the output node 210 and voltage, Vout, between the output node 210 and the return node 212. Although not required, the return node may be a ground connection.

The metrology component 620 may receive and sample signals from one or more bias-supply-signal lines 624. The bias-supply signal lines 624 may convey signals indicative of bias-supply parameters such as $I_{comp}$, temperature, and other parameters within the bias supply 208. A current-signal line 626 may provide analog signals from a current transducer that are indicative of output current, $I_o$, provided to the output node 210, and a voltage line 628 may provide analog signals that are indicative of the voltage, Vout, at the output of the bias supply. In response to receiving the power-related signals (indicative of Io and Vout), the metrology component 620 samples and digitizes the power-related signals. For example, the metrology component 620 may provide complete digital representations of the asymmetrical periodic voltage waveform, Vout; the output current, $i_{out}$, and/or $i_{comp}$.

An aspect of many variations of the metrology component 620 is that the complete voltage and current waveforms are captured, which provides enhanced visibility of the output of the bias supply, and also enables improved control aspects disclosed further herein.

Although not required, the metrology component 620 may be realized in part by a field programmable gate array, and the digital control section may be realized by one or more processors that execute code stored in non-transitory media (to effectuate the functions of the digital control section 622). But other combinations of hardware, software, and firmware may be used to realize the metrology component 620 and the digital control section 622.

As shown, the digital representations of the asymmetrical periodic voltage waveform, Vout; the output current, $i_{out}$ and/or $i_{comp}$ may be provided to a data reporting component 631, which may be a user interface (e.g., a touchscreen display). In addition, the digital representations of the asymmetrical periodic voltage waveform, Vout; the output current, $i_{out}$ and/or $i_{comp}$ are provided to a data processing module, which may further process the digital representations of the asymmetrical periodic voltage waveform, Vout; the output current, $i_{out}$ and/or $i_{comp}$ to provide readback of one or more of sheath voltage, Vs, and one or more other parameter values such as Eion, Vstep, ΔEion, output voltage slope (e.g., the slope of the third portion of the asymmetrical periodic voltage waveform), and/or a slope deviation factor, Ks.

The slope deviation factor, Ks, may be calculated as:

$$K_s = \frac{C_{chuck}}{C_{chuck} + C_{stray1}} \times \frac{Slope_w}{Slope}$$

where $slope_w$ is the slope from t3 to t4 of wafer/sheath voltage.

Or in the alternative, the slope deviation factor may be calculated to satisfy the following equation:

$$(1 - K_s)\left(1 + \frac{C_{stray1}}{C_{chuck}}\right) \cdot Slope + \frac{I_o}{C_{chuck}} = 0$$

The slope deviation factor, Ks, provides a convenient representation of a level of compensation current, $I_{comp}$, relative to the ion current, $I_{ion}$. For example, when Ks is equal to zero, the compensation current is providing a full compensation; when Ks>0, $I_{comp}$ is overcompensating for the ion current, and when Ks<0, the compensation current, $I_{comp}$, is undercompensating for the ion current, $I_{comp}$.

As shown, the readback values (depicted for example as readback1 and readback 2) may also be used as part of feedback control. As shown, a first comparator 638 may calculate a difference between a first setpoint, setpoint1, and a first readback value, readback1, to produce a first error signal, error1. And a second comparator 640 may calculate a difference between a second setpoint, setpoint2, and a second readback value, readback2, to produce a second error signal: error2. As shown, the error signals (error1 and error 2) are fed to one or more compensators 632, and the one or more compensators 632 may provide control signals (Ctrl_knob1 and Ctrl_knob2) to the bias supply 208 as described further herein.

Also shown within the digital control section 622 is a timing parameter estimator 634, which may receive the digital representations of the output waveform, Vout, and the output current, $I_{out}$, and produce a pulse-width control signal. According to an aspect, the timing parameter estimator 634 detects when there is zero current through switches of the bias supply to reduce switching-related losses. The timing parameter estimator 634 may also determine $t_{reset}$ (shown in FIGS. 4 and 5), and the value for $t_{reset}$ may be reported via the data reporting component 631 and the value for $t_{reset}$ may be provided to the data processing module 630. The timing parameter estimator 634 may also be configured (e.g., with firmware, hardware, and/or programmed FPGAs, for example) to carry out the transition control methods discussed herein.

The digital control section 622 also comprises a gate drive signal generator 636 that is configured to provide gate drive signals to the switches (S1, S2) of the bias supply 208 responsive to the pulse-width control signal 637 from the timing parameter estimator 634 and/or responsive to a control signal 639 output by the one or more compensators 632. Although many types of switches are controlled by electrical gate drive signals, it is also contemplated that optical control signals may be used. For example, the gate drive signal generator 636 may provide optical signals.

Figure 7:
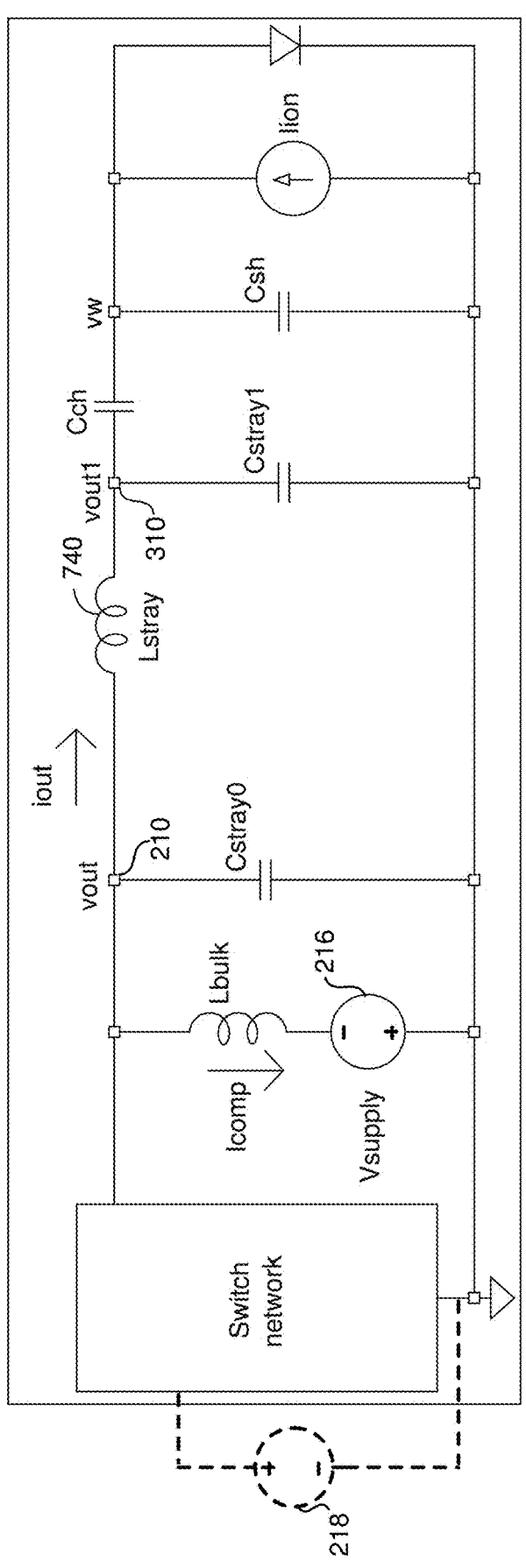
FIG. 7 is a schematic diagram depicting inductance that affects a voltage applied to a plasma chamber relative to a bias supply.

Another aspect of the capabilities of the data processing module 630 is the ability to compensate for inductance between the output 210 of the bias supply 208 and the input 310 to the plasma chamber. Referring to FIG. 7, shown is a lumped-element inductance 740 (also referred to as stray inductance 740) representing inductive elements between the output 210 of the bias supply 208 and the input 310 to the plasma chamber. In many implementations, the digital representations of the asymmetric periodic voltage waveform (output by the metrology component 620) may be adjusted, e.g., by the data processing module 630, (to obtain an adjusted digital representation of the asymmetric periodic voltage waveform) to compensate for the stray inductance 740. By compensating for the inductance 740, Vstep at the input 310 to the plasma chamber may be calculated; a wafer voltage value may be calculated; and an ion energy value Eion may be calculated.

Figure 8A:
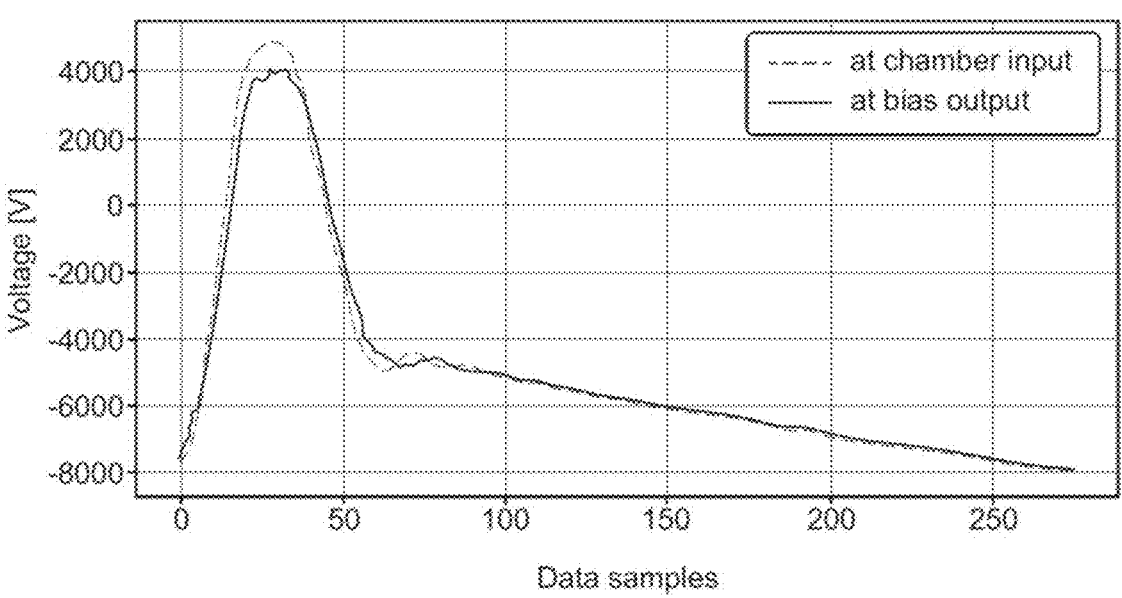
FIG. 8A is a graph depicting the effect of the inductance depicted in FIG. 7.

As shown in FIG. 8A, due to the inductance 740, the voltage, vout1, actually applied at the input 310 to the plasma processing chamber 101 differs from the voltage, Vout, applied at the output node 210 of the bias supply 208. As a consequence, the data processing module 630 may be configured to estimate the voltage, vout1, actually applied to the plasma processing chamber 101:

$$v_{out1} = v_{out} - L_{stray}\frac{di_{out}}{dt}$$

where Lstray is the inductance 740. It should be noted that that in the presence of noise and parasitic ringing, the vout and iout signals can be filtered in the metrology component 620 and/or digitally filtered in the data processing module 630 before all the calculations are performed.

Figure 8B:
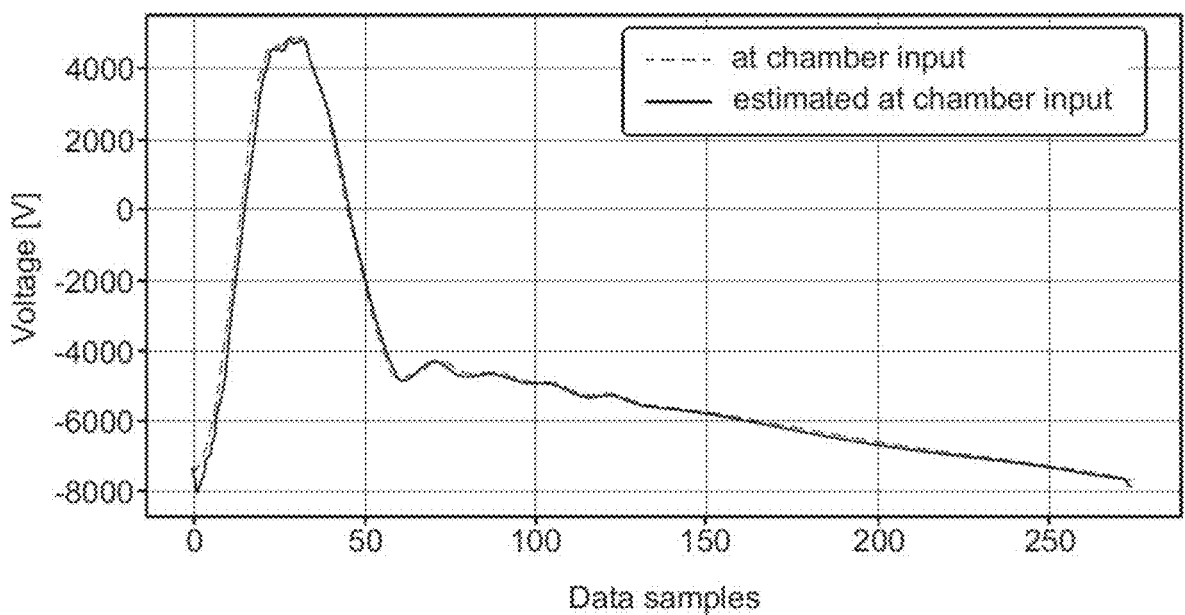
FIG. 8B is a graph depicting the results of a method to compensate for the inductance depicted in FIG. 7 to mitigate against the effect depicted in FIG. 7.

As shown in FIG. 8B, the estimated voltage, vout1, closely matches the actual voltage at the chamber input 310.

In addition, Eion may be more accurately calculated by taking the inductance into consideration:

$$E_{ion} \approx \frac{C_{ch}}{C_{ch}+C_{sh}}\left[V_{step} + L_{stray}\left(\frac{di_{out}}{dt}\bigg|_{t_{3reset}} - \frac{di_{out}}{dt}\bigg|_{t_{vmax2}}\right)\right]$$

Wafer voltage may also be more accurately reconstructed by compensating for the inductance 740. Referring to FIGS.

Figure 9A:
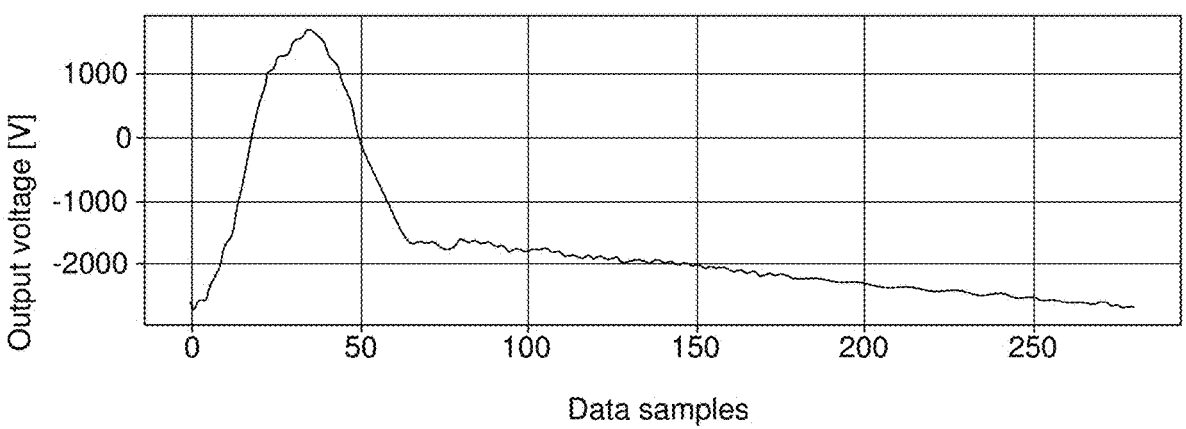
FIG. 9A depicts an example of an asymmetric periodic voltage waveform.
Figure 9B:
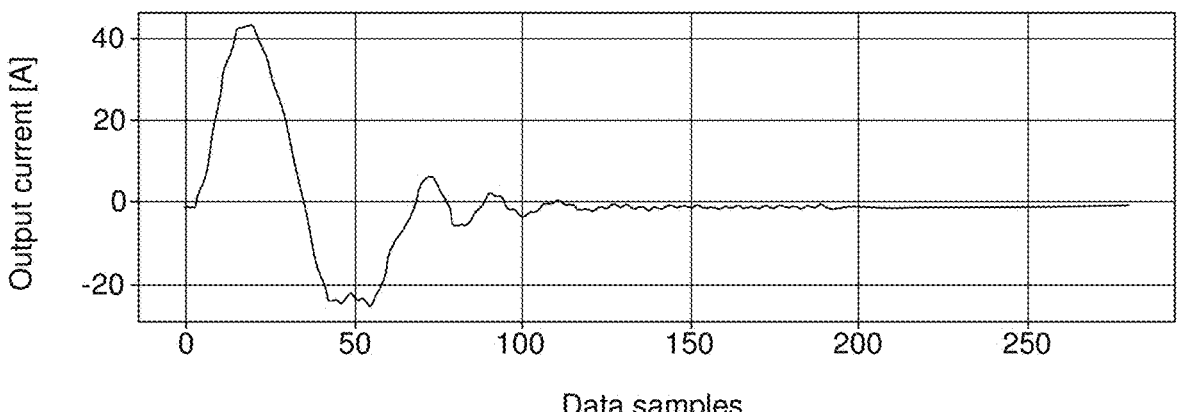
FIG. 9B depicts an example of output current associated with the asymmetric periodic voltage waveform depicted in FIG. 9A.
Figure 9C:
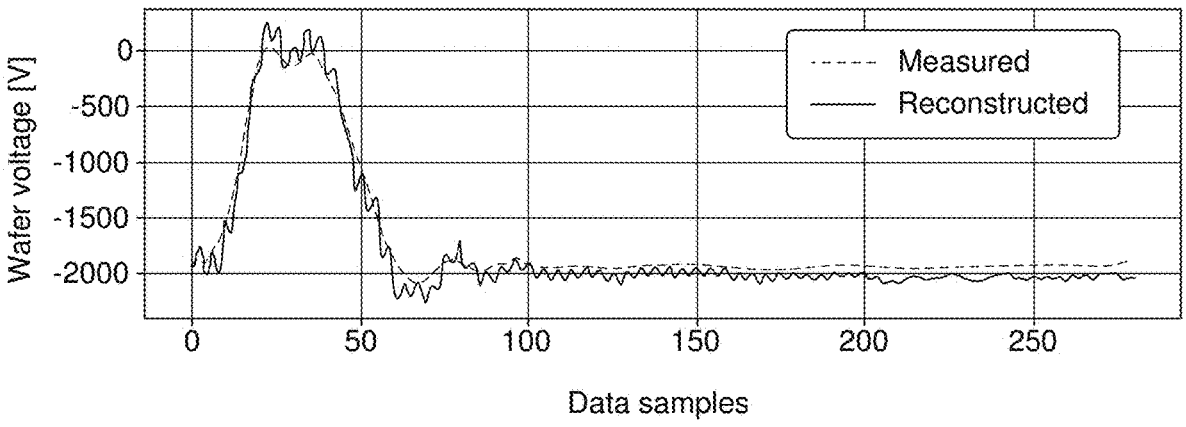
FIG. 9C depicts a wafer voltage reconstructed from the voltage waveform of FIG. 9A and the current waveform of FIG. 9B according to a method disclosed herein.

9A and 9B, shown are examples of output voltage and output current associated with operation of a bias supply 208. And FIG. 9C shows measurements of an actual wafer voltage in comparison with a reconstructed wafer voltage that is reconstructed using the data from FIGS. 9A and 9B.

For example, the reconstructed wafer voltage, Vw, may be determined as:

$$v_w(t) = v_w(t_0) + \frac{C_{ch}+C_{stray1}}{C_{ch}}[v_{out1}(t) - v_{out1}(t_0)] - \frac{1}{C_{ch}}\int_{t_0}^{t} i_{out}dt$$

Where $C_{stray1}$ is a lumped-element capacitance representing capacitance from an output of the bias supply 208 to an input 310 of the chamber 101 (including a capacitance of a connector and filter capacitance).

And FIG. 9C shows how close the reconstructed wafer voltage is to the actual, measured wafer voltage. It should be noted that in some implementations, by virtue of capturing the entire current and voltage waveforms (as described with reference to FIG. 6), a complete reconstruction of the wafer waveform may be obtained.

Figure 10:
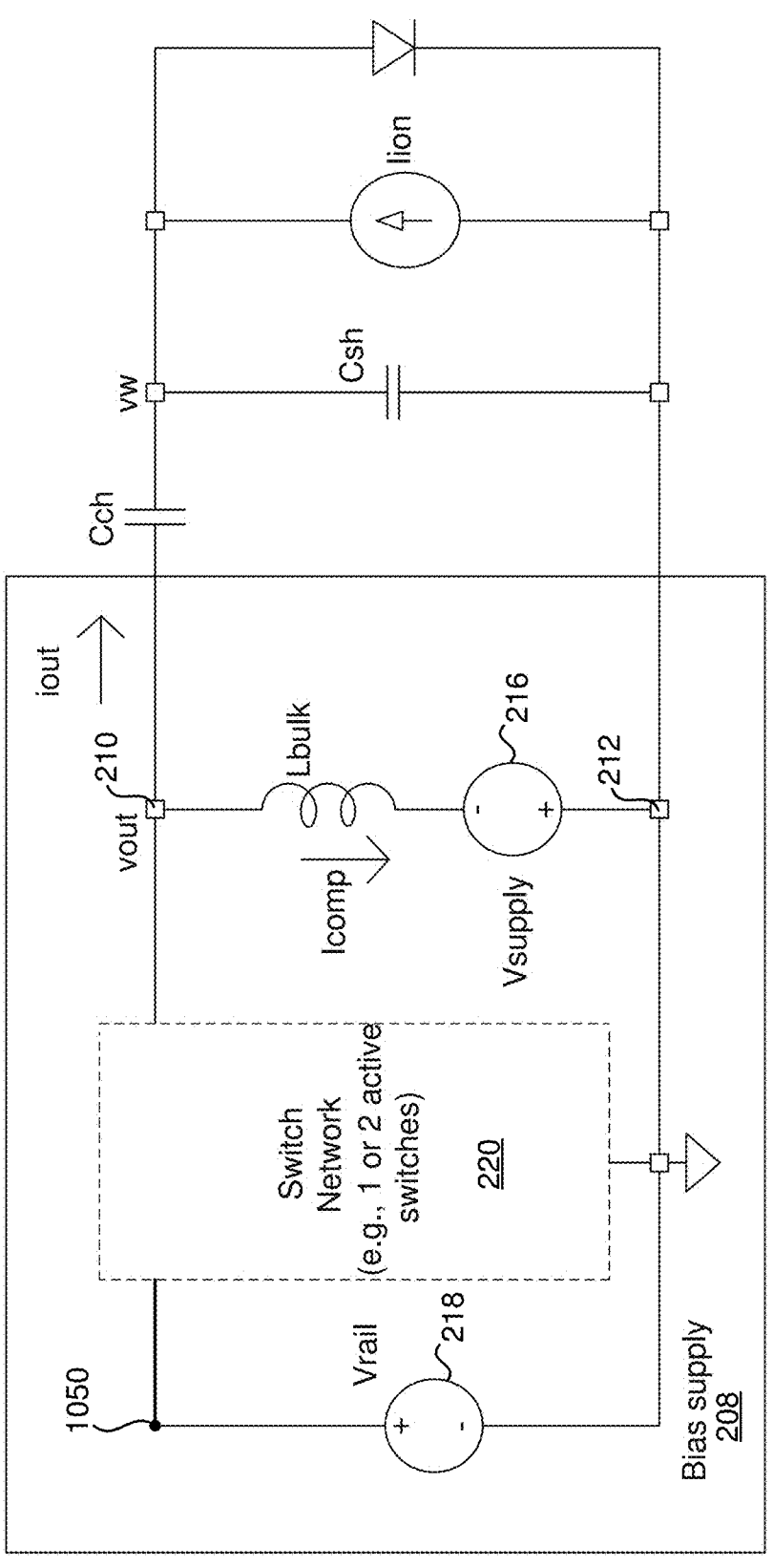
FIG. 10 is a schematic diagram depicting an example of a bias supply with two power supplies.
Figure 11:
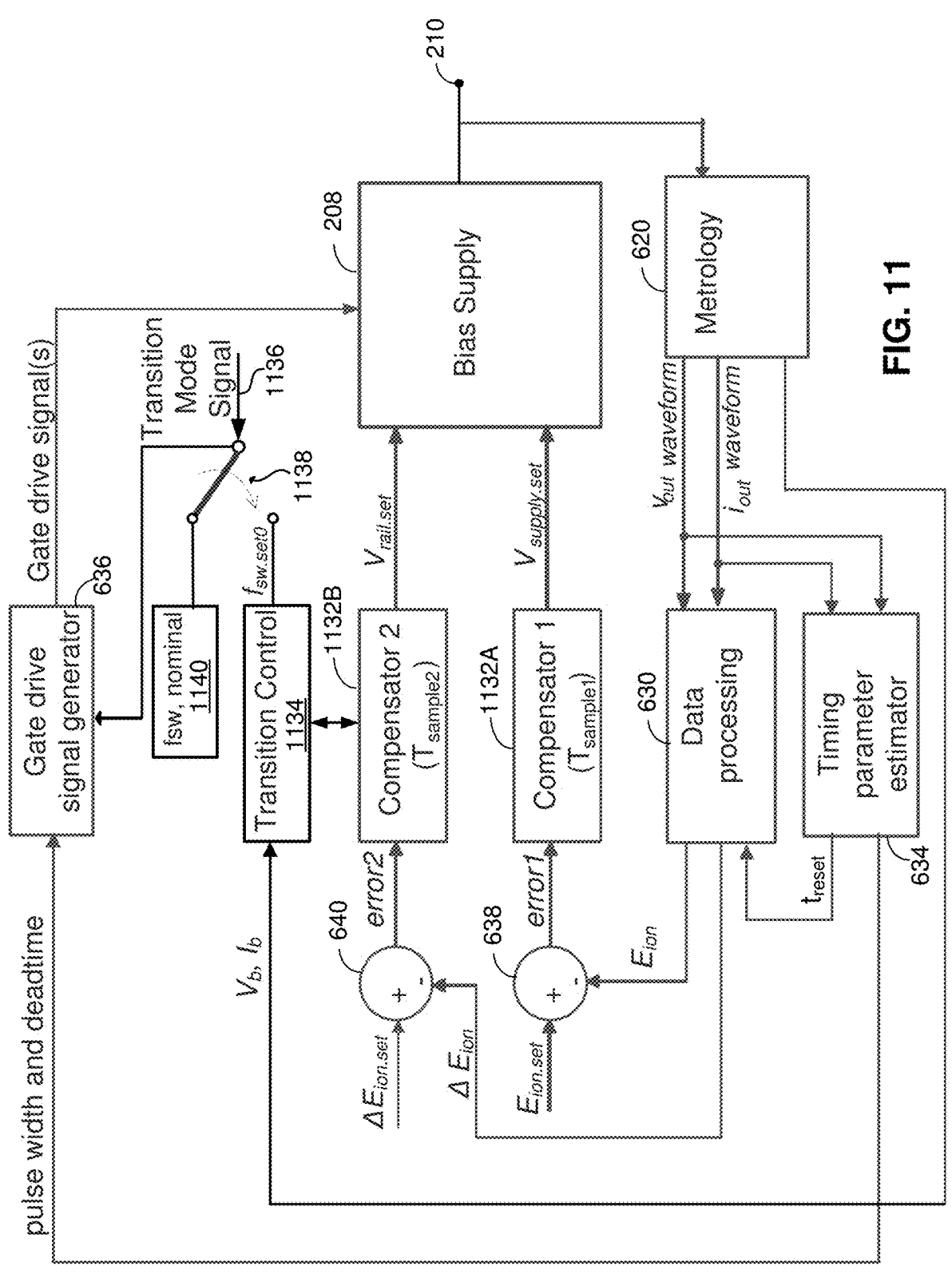
FIG. 11 is a block diagram depicting a control system for a bias supply with two power supplies such as the bias supply depicted in FIG. 10.

Referring next to FIGS. 10 and 11, shown are examples of a bias supply 208 (comprising two power supplies) and a corresponding control system, respectively. More specifically, FIG. 10 is an example of the bias supply 208 that comprises the first power supply (Vsupply) 216 and the second power supply (Vrail supply) 218 so that the bias supply in FIG. 10 is a two-supply configuration, and FIG. 11 is a block diagram depicting examples of control aspects that may be utilized in connection with two-supply configurations such as the two-supply configuration depicted in FIG. 10. The switch network 220 may comprise a variety of different topologies including one or two switches, and as shown, the switch network 220 couples to the bias supply 208 at node 1050 (which is coupled to a positive output of the second power supply 218); at node 212 (which is coupled to a negative output of the second power supply 218); and at the output node 210.

As shown in FIG. 11, the control system may comprise two control "knobs" to control the DC voltages of Vsupply and Vrail. This approach is in contrast to prior approaches that control compensation current, $i_{comp}$, (to control a width of a distribution of ion energies) and control Vrail to achieve a desirable ion energy value, eV. In the approach depicted in FIG. 11, the voltages of the first power supply 216 (Vsupply) and the voltage of the second power supply (Vrail) may be controlled based on a general relationship:

$$\begin{bmatrix} \Delta Eion \\ Eion + \Delta Eion \end{bmatrix} = \begin{bmatrix} K_{11} & \varepsilon_{12} \\ 0 & K_{22} \end{bmatrix}\begin{bmatrix} V_{rail} \\ V_{supply} \end{bmatrix} + \begin{bmatrix} -1 \\ -1 \end{bmatrix}\frac{I_{ion}}{C_{ch}+C_{sh}}t_{ramp}$$

$$\approx \begin{bmatrix} K_{11} & 0 \\ 0 & K_{22} \end{bmatrix}\begin{bmatrix} V_{rail} \\ V_{supply} \end{bmatrix} + \begin{bmatrix} -1 \\ -1 \end{bmatrix}\frac{I_{ion}}{C_{ch}+C_{sh}}t_{ramp}$$

Where:

$$K_{11} = -\frac{C_{ch}}{C_{ch}+C_{sh}}\frac{2}{1+K}$$

$$K = \frac{1-K_c}{1+K_c\frac{V_{step}}{V_{ramp}}}, \text{ where } Vramp = vout(t3) - vout(t4);$$

$$K_c = \frac{C_{str} + \frac{C_{ch}C_{sh}}{C_{ch}+C_{sh}}}{C_{str}+C_{ch}}, \text{ where } Cstr = Cstr0 + Cstr1;$$

-continued $$\varepsilon_{12} = \frac{C_{ch}}{C_{ch} + C_{sh}} \frac{2K}{1+K} \frac{T_{sw}}{t_{ramp}} ; \text{ and}$$

$$K_{22} = \frac{C_{ch}}{C_{ch} + C_{sh}} \frac{2T_{sw}}{t_{ramp}},$$

where Tsw is the switching period (from $t_4$-$t_0$).

In this control approach, a first setpoint may be an ion energy setpoint, Eion_set and a second setpoint may be for a spread (also referred to as a distribution) of ion energies, ΔEion_set (both Eion_set and ΔEion_set are shown in FIG. 4), and the data processing module 630 may calculate Eion and ΔEion based upon the digital representations of $i_{out}$ and Vout received from the metrology component 620. As shown, the first comparator 638 may produce the first error signal, error1, based upon the difference between the first setpoint, Eion_set, and the calculated value of Eion, and the second comparator 640 may produce a second error signal, error2, based upon the difference between the second setpoint, ΔEion_set, and the calculated value of ΔEion.

Alternatively, the first setpoint (to set an ion energy value) may be a Vstep setpoint and the second setpoint (to set the spread of ion energies) may be a slope setpoint (to set the slope, of the third portion (between times t3 and t4) of the asymmetric periodic voltage waveform) or the second setpoint may be a slope-deviation-factor setpoint (to set the slope deviation factor, Ks). The data processing module 630 may calculate Vstep and the slope or the slope deviation factor, Ks based upon the digital representations of $i_{out}$ and $V_{out}$ received from the metrology component 620. In this alternative, the first comparator 638 may produce the first error signal, error1, based upon the difference between the first setpoint (e.g., a Vstep setpoint) and the calculated value of Vstep, and the second comparator 640 may produce a second error signal, error2, based upon the difference between the second setpoint (either a slope setpoint or a slope-deviation-factor setpoint) and the calculated value of the slope or the calculate value of the slope deviation factor, Ks.

As shown, the control system may comprise two compensators: a first compensator 1132A and a second compensator 1132B associated with two control loops. And the first compensator 1132A may receive the first error signal, error1, and produce a signal, Vsupply_set, to control the first power supply 216. The second compensator 1132B may receive the second error signal, error2, and produce a signal, Vrail_set, to control the second power supply 218. In some variations, the gate drive signal generator 636 may be set with fixed switching times for the first switch (and second switch in a two-switch bias supply) of the bias supply 208. In other variations, the timing parameter estimator 634 may provide a pulse-width signal so that the gate drive signal generator 636 may close the switches of the bias supply 208 to provide zero-current switching. Each of the compensators 1132A, 1132B may be realized by a proportional-integral-derivative (PID) controller, and in some variations, a bandwidth of the first compensator 1132A is set to be different from the bandwidth of the second compensator 1132B, which enables the two control loops associated with each of the compensators 1132A, 1132B to be decoupled. For example, a sampling rate of each control loop may be set to a different rate to result in the different bandwidths. Another option, as generalized in FIG. 6, a single control loop associated with MIMO compensator 632 can be used with multiple inputs (shown generally as error1 and error2 in FIG. 6) and multiple outputs where Ctrl_knob1 and Ctrl_knob2 in FIG. 6 may be Vsupply_set and Vrail_set, respectively.

Also shown in FIG. 11 is a transition control module 1134 that may be used to realize the transition control module 234 depicted in FIG. 2. The transition control module 1134 is configured to produce a transition-frequency control signal, fsw.set0, to control the fundamental frequency of the asymmetrical periodic voltage waveform during transitions (using methodologies disclosed further herein) between the various steady states. As shown, a transition mode signal 1136 (e.g., from the bias control portion 232) triggers (e.g., in response to a state change) a transition switch 1138 to change between a nominal frequency control position 1140, e.g., steady state control (using the pulse width or deadtime signal from the timing parameter estimator) and a transition control (using the transition control module 1134). It should be recognized that the transition control module 1134 and transition switch 1138 may be realized as control logic that may be implemented by, for example and without limitation, hardware, a field programmable gate array, and/or firmware.

Figure 12:
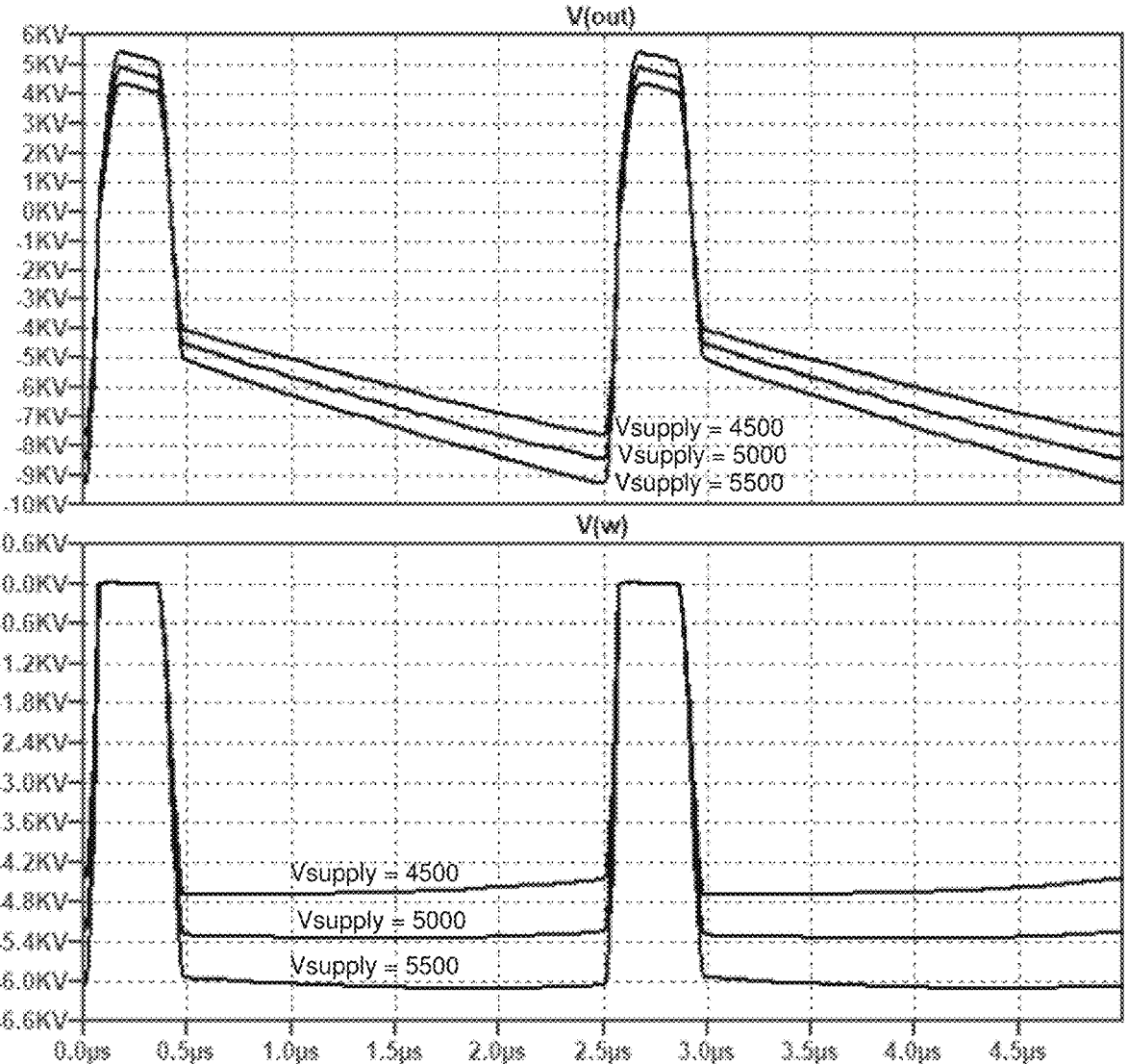
FIG. 12 includes graphs depicting examples of asymmetric periodic voltage waveforms and corresponding sheath and wafer voltages consistent with a mode of operating the bias supply of FIG. 10 using the control system of FIG. 11.
Figure 13:
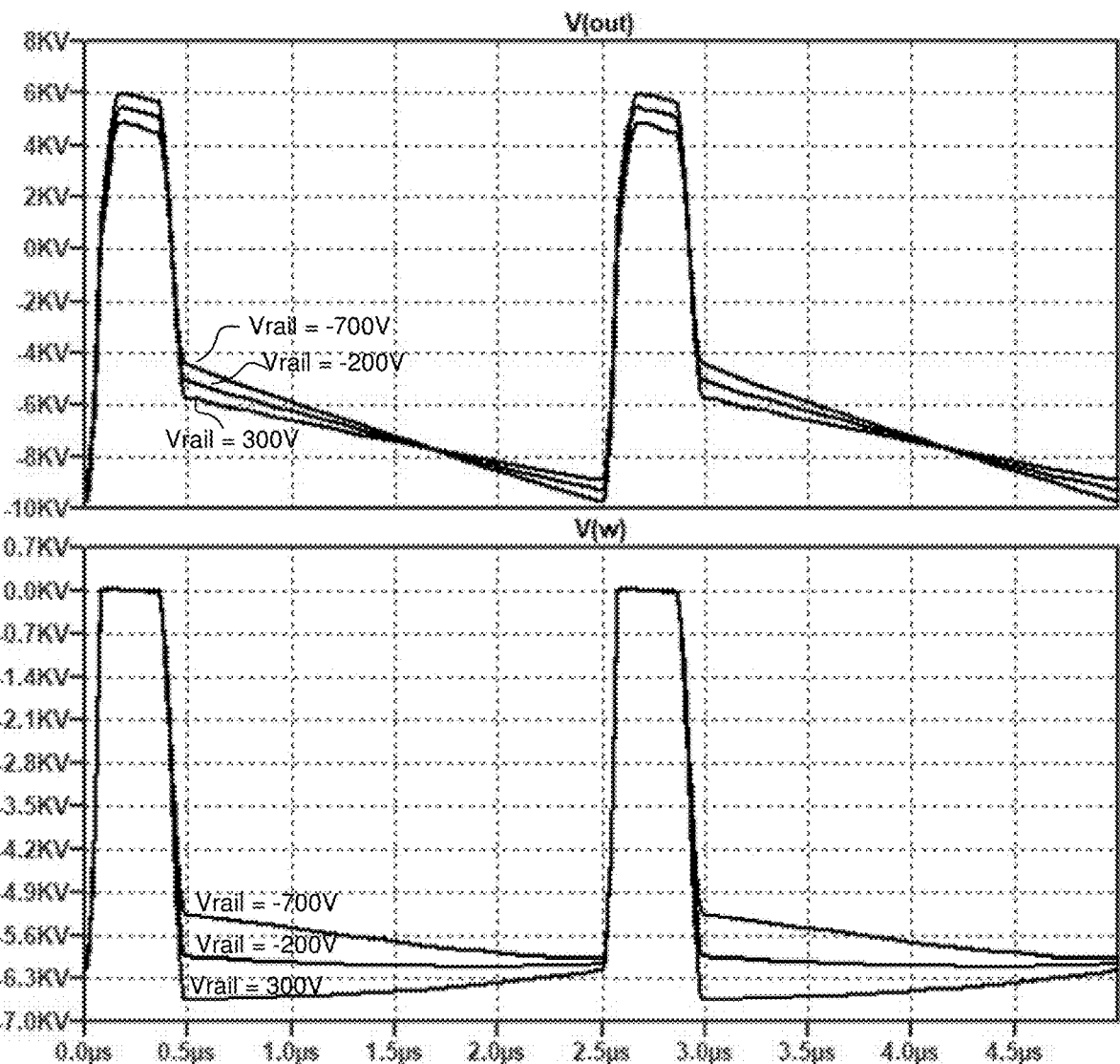
FIG. 13 includes graphs depicting examples of asymmetric periodic voltage waveforms and corresponding sheath and wafer voltages consistent with another mode of operating the bias supply of FIG. 10 using the control system of FIG. 11.

Referring to FIGS. 12 and 13, shown are examples of how the first power supply 216 and the second power supply 218 may be controlled. More specifically, in the graphs shown in FIG. 12, the voltage of the second power supply 218 (Vrail) is fixed at −2000V and three examples of the asymmetric periodic voltage waveforms are depicted when the first power supply 216 is set to 4500V, 5000V, and 5500V. Also shown are three wafer voltage V(w) waveforms that correspond to the three asymmetric periodic voltage waveforms.

In FIG. 13, shown are graphs of three examples where the voltage of the first power supply 216 is set to 5500V and the voltage of the second power supply 218 is set to 300V, −200V, and −700V. Also shown are three wafer voltage V(w) waveforms that correspond to the three asymmetric periodic voltage waveforms. FIGS. 12 and 13 are provided merely as examples of the ability to effectuate a desired ion energy value and ion energy distribution using the first power supply 216 and the second power supply 218, but it should be recognized that in many variations both the first power supply 216 and the second power supply 218 are variable power supplies that may be adjusted and controlled using the control system depicted in FIG. 11.

Figure 14A:
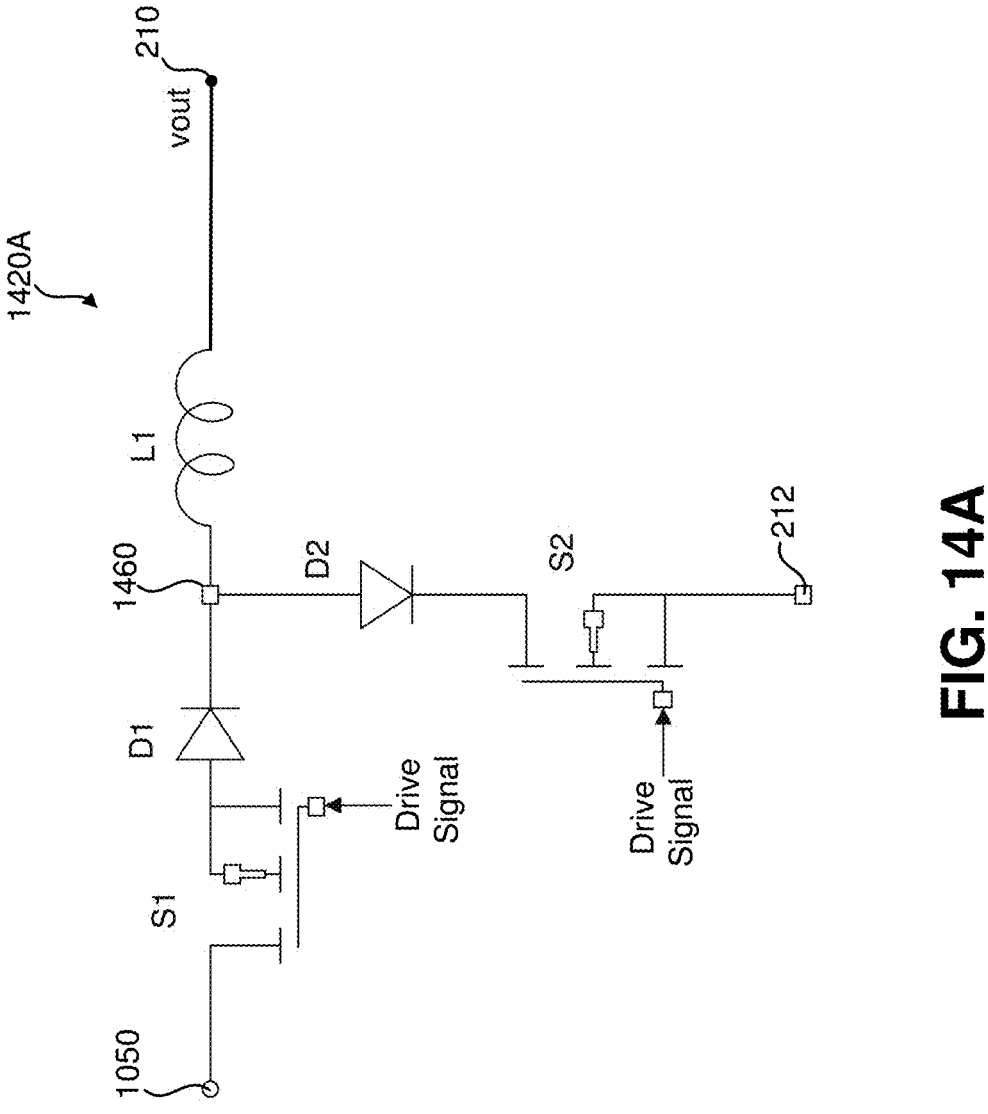
FIG. 14A is a schematic diagram depicting an example of the switch network depicted in FIG. 10 that comprises two active switches.
Figure 14B:
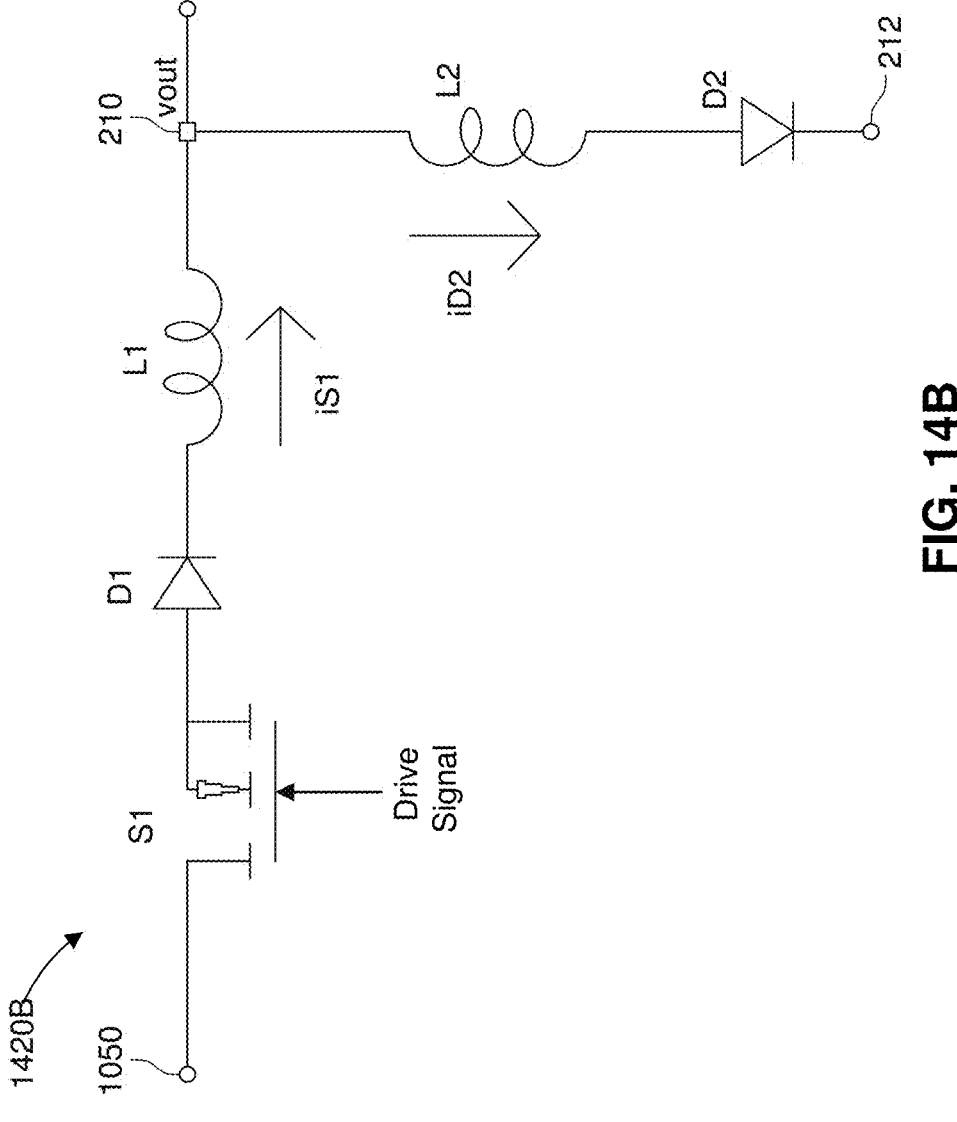
FIG. 14B is a schematic diagram depicting another example of the switch network depicted in FIG. 10 that comprises one active switch.

Referring next to FIGS. 14A and 14B, shown are examples of switch networks that may be used in connection with the two-supply configuration of FIG. 10. Referring first to FIG. 14A, the switch network 1420A is a two-switch network that couples to the bias supply 208 at node 1050, the return node 212, and the output node 210. Also shown for reference in the switch network is node 1460. As depicted, the switch network 1420A comprises a first switch, S1, arranged in series with a first diode D1 between node 1050 and node 1460. A cathode of the diode D1 is coupled to the node 1460 and an anode of the diode D1 is coupled to the switch S1. The switch network 1420A also comprises a second switch S2 (arranged in series with a second diode D2) between the return node 212 and node 1460. An anode of the diode D2 is coupled to the node 1460 and a cathode of the diode D2 is coupled to the switch S2. In addition, an inductor L1 is positioned between the node 1460 and the output node 210.

In operation, the switches (S1 and S2) are operated, as described with reference to FIG. 4, to create the asymmetric periodic waveform $V_{out}$ and the output current $I_{out}$ depicted in FIG. 4. It should be recognized that (because the switch S1 and the diode D1 are arranged in series the order of the switch S1 and the diode D1 may be swapped. Similarly, because the switch S2 and the diode D2 are arranged in series, the order of the switch S2 and the diode D2 may be swapped.

In many implementations, the switches disclosed herein are realized by a field-effect switches such as metal-oxide semiconductor field-effect transistors (MOSFETS), and in some implementations, the switches are realized by silicon carbide metal-oxide semiconductor field-effect transistors (SiC MOSFETs) or gallium nitride metal-oxide semiconductor field-effect transistors (GaN MOSFETs). As another example, the switches may be realized by an insulated gate bipolar transistor (IGBT). In these implementations, the gate drive signal generator 636 may comprise an electrical driver known in the art that is configured to apply electrical drive signals to the switches responsive to signals from the timing parameter estimator 634 and/or the one or more compensators 632. It is also contemplated that the drive signals may be sent via optical lines to convey optical switching signals. And the switches may switch in response to the optical signal and/or optical signals that are converted to an electrical drive signal.

It should be recognized that each of the switches depicted herein generally represents one or more switches that are capable of closing and opening to connect and disconnect, respectively, a current pathway. For example, each of the switches may be realized by a plurality of switches arranged is series (for enhanced voltage capability), may be realized by a plurality of switches arranged is parallel (for enhanced current capability), or each of the switches may be comprised of a plurality of switches arranged in a series-parallel combination (for enhanced voltage and or current capability). In these variations, one of ordinary skill in the art will recognize that each switch may be synchronously driven by a corresponding drive signal.

It should also me be recognized that any of the diodes depicted herein may be realized by a plurality of diodes. For example, any diode may be realized by a plurality of series-connected diodes (to enhance voltage capability), may be realized by a plurality of diodes arranged in parallel (to enhance current capability), or may be comprised of a plurality of diodes arranged in a series-parallel combination (for enhanced voltage and or current capability).

Referring next to FIG. 14B shown is another example of the switch network 220 depicted in FIGS. 2 and 10. As shown, the switch network 14B comprises a first current pathway (for current iS1), between the node 1050 and the output node 210. The first current pathway comprises a series combination of a switch S1 a diode D1 and an inductor L1. In addition, the switch network 1420B comprises second current pathway (for current iD2), (between the output node 210 and the return node 212), which comprises a second diode D2 and an inductive element, L2.

In operation, the switch S1 in switch network 1420B may be operated as shown in FIG. 5 to create the asymmetric periodic waveform $V_{out}$ and the output current out depicted in FIG. 5. It should be recognized that (because the switch S1 the diode D1 and the inductor L1 are arranged in series), the order in which the switch S1 the diode D1 and the inductor L1 are positioned (between node 1050 and the output node 210 may be swapped.

Figure 15:
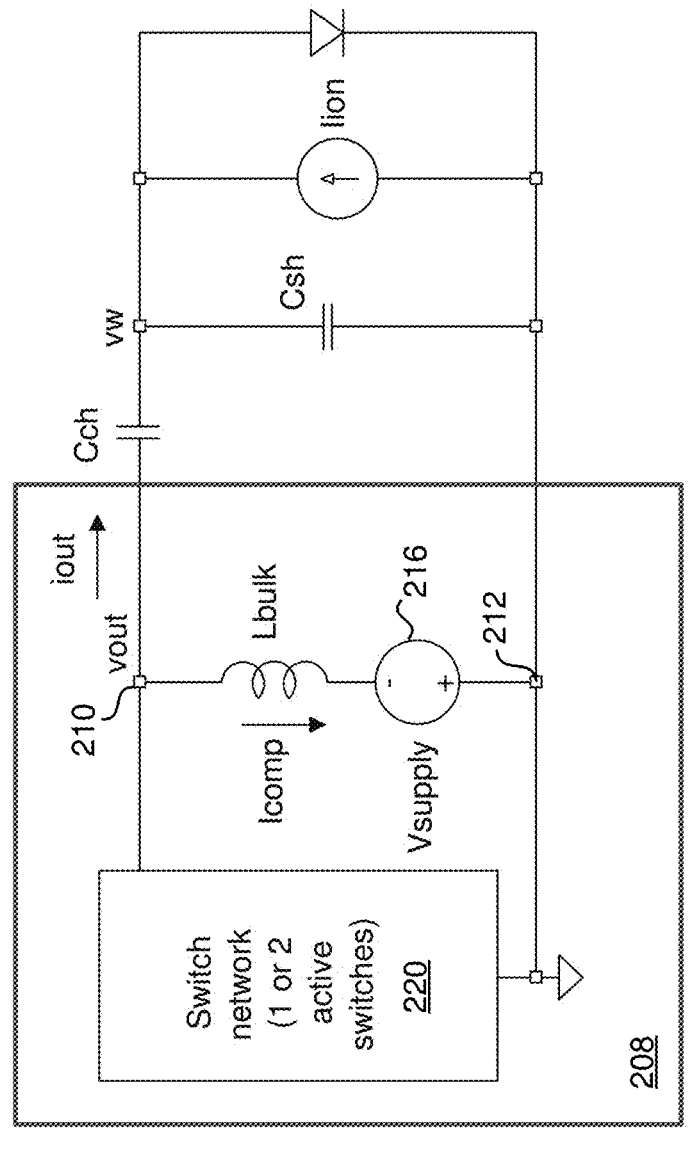
FIG. 15 is a schematic diagram depicting yet another example of a bias supply with a single power supply.
Figure 16:
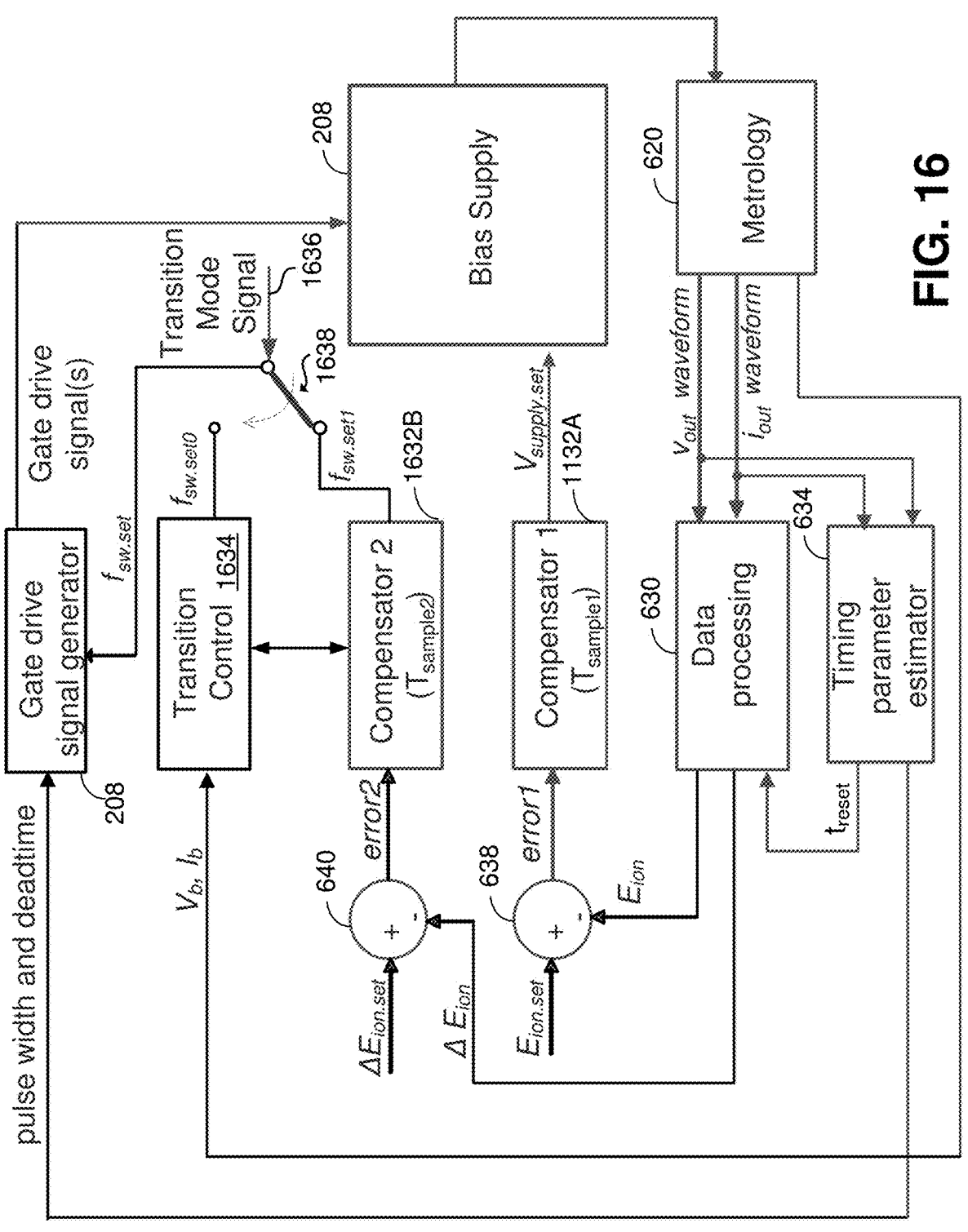
FIG. 16 is a block diagram depicting a control system for a bias supply with a single power supply such as the bias supply depicted in FIG. 15.
Figure 17:
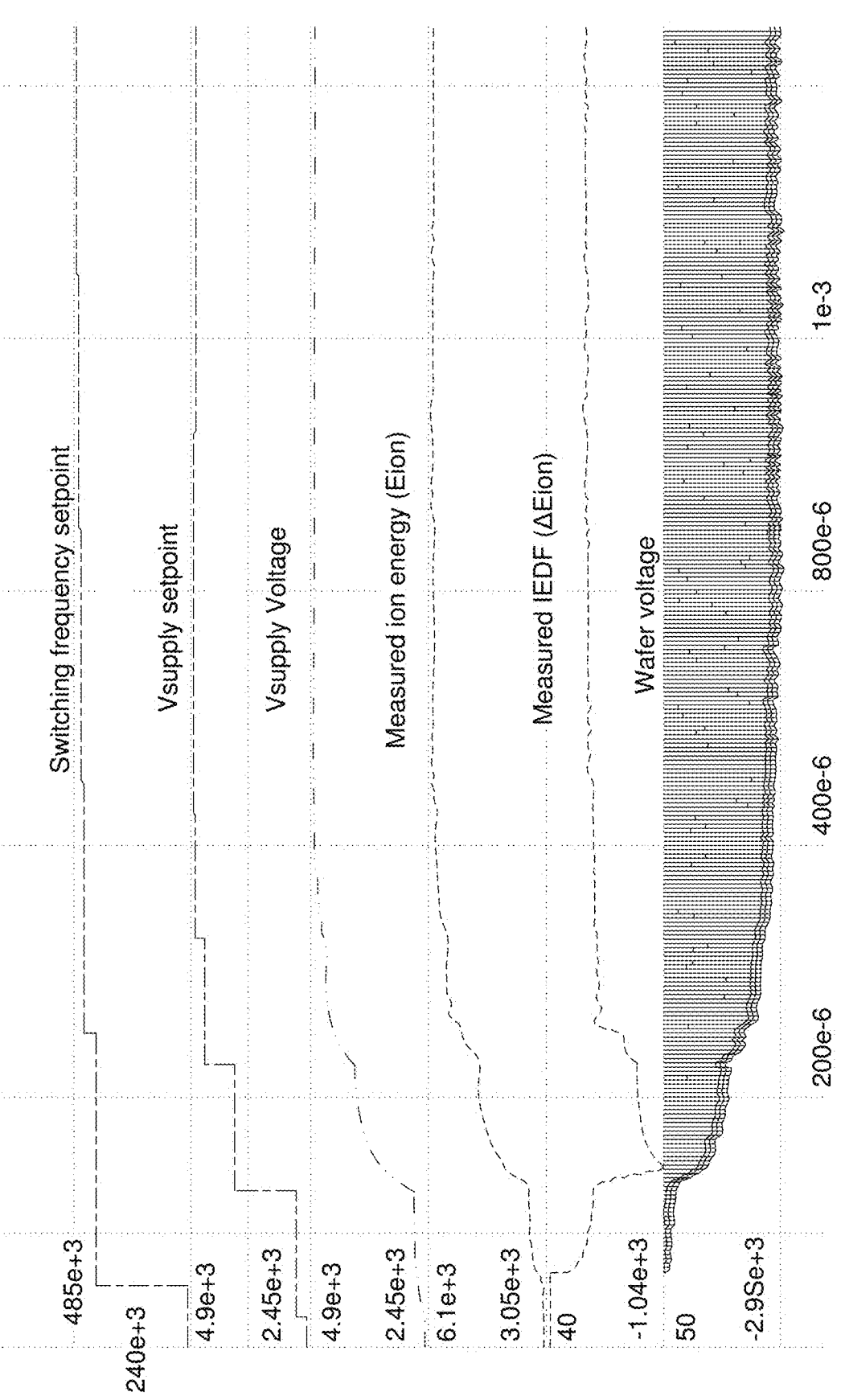
FIG. 17 includes graphs depicting an example of operational aspects of the bias supply depicted in FIG. 15 when controlled by the control system of FIG. 16.

Referring next to FIGS. 15 and 16, shown are a schematic diagram (depicting the bias supply 208 with the first power supply 216 as a single power supply) and a block diagram depicting a control system for the bias supply 208, respectively. As shown, the control system for a single supply configuration is similar to the control system for a two-supply configuration (described with reference to FIG. 11)

except the second compensator 1632B provides a frequency setpoint signal $F_{sw\_set1}$ to control a frequency of the switching of the bias supply 208. As shown in FIG. 17, switching frequency in connection with the voltage applied by the first power supply 216 may be used to effectuate a desired ion energy value, Eion, and a desired ion energy distribution, ΔEion.

Figure 18A:
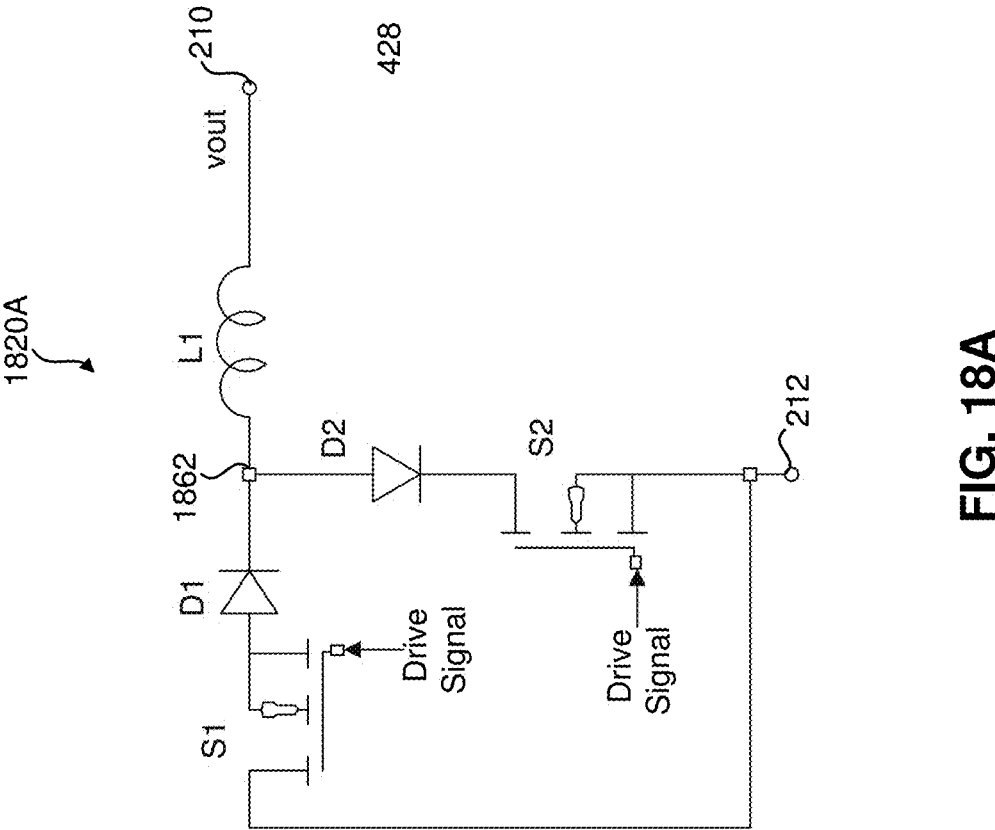
FIG. 18A is a schematic diagram depicting an example of the switch network depicted in FIG. 15 that comprises a single active switch.

Referring next to FIG. 18A, shown is a schematic depicting a switch network 1820A that is an example of the switch network 220 that comprises two switches: a first switch S1 and a second switch S2. In the variation depicted in FIG. 18A, a series combination of the first switch S1 and the first diode D1 is arranged between the return node 212 of the bias supply 208 and node 1862. In addition, a series combination of the second switch S2 and the second diode D2 is arranged between the node 1862 and the return node 212 of the bias supply 208. As shown in FIG. 18A, the first diode D1 is arranged between the first switch S1 and the node 1862 with its anode coupled to the first switch S1 and its cathode coupled to the node 1862. The second diode D2 is arranged between the second switch S2 and the node 1862 with its cathode coupled to the second switch S2 and its anode coupled to the node 1862. In this arrangement, the cathode of the first diode D1 is coupled to the anode of the second diode D2 at the node 1862.

In operation, first diode D1 conducts when the first switch S1 is closed, and a second diode D2 conducts when the second switch D2 is closed. And the first switch S1 and the second switch S2 are controlled as depicted in FIG. 4 to produce the asymmetric periodic voltage waveform Vout and the output current $i_{out}$ (shown in FIG. 4). Although not depicted, it should be recognized that the position of the first switch S1 and the position of the first diode D1 may be swapped. Similarly, the position of the second switch S2 and the position of the second diode D2 may be swapped.

Figure 18B:
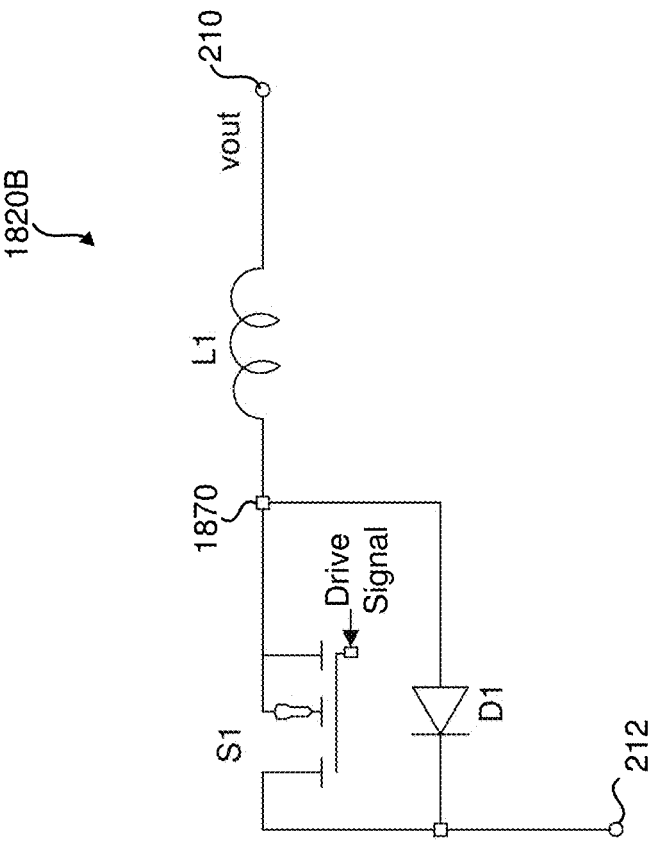
FIG. 18B is a schematic diagram depicting another example of the switch network depicted in FIG. 15 that comprises a bidirectional switch.

Referring to FIG. 18B, shown is a schematic drawing depicting a switch network 1820B that is another example of the switch network 220 that comprises a bidirectional switch: S1. As shown, a first inductor L1 is coupled between a node 1870 and the output node 210. And the switch S1 is coupled between the node 1870 and the return node 212. A diode D1 is coupled in parallel with the switch S1 between the node 1870 and the return node 212. In operation, the switch S1 is opened and closed, as shown in FIG. 5, to produce the asymmetric periodic voltage function Vout and the output current $i_{out}$ shown in FIG. 5. For example, an application of the asymmetric periodic voltage waveform is effectuated between the output node 210 and the return node 212 by closing the switch S1 to cause the output current $i_{out}$ to change from $-I_o$ to a peak value and back to $-I_o$. After the switch S1 is opened the current increases to a peak value in an opposite direction and back to $-I_o$. To reduce losses, the timing parameter estimator 634 may optionally detect when the output current $I_{out}$ is reaching $I_o$ and provide the gate drive signal generator 636 a signal to cause the switch S1 to open when the output current $i_{out}$ is at $I_o$.

Figure 18C:
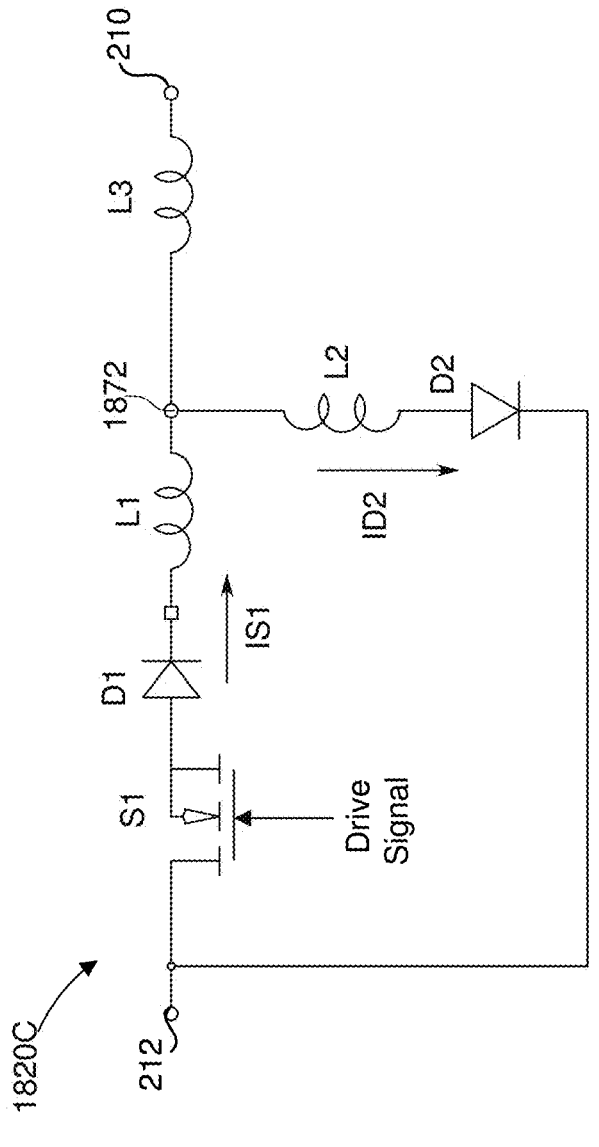
FIG. 18C is a schematic diagram depicting yet another example of the switch network depicted in FIG. 15 that comprises a single active switch.

Referring to FIG. 18C, shown is a schematic drawing depicting a switch network 1820C that is another example of the switch network 220 that comprises a single switch: S1. As shown, the switch network 1820C comprises a first current pathway (for current iS1), between the return node 212 and node 1872. The first current pathway comprises a series combination of the switch S1 a diode D1 and an inductor L1. In addition, the switch network 1820C comprises second current pathway (for current iD2), (between the node 1872 and the return node 212), which comprises a second diode D2 and an inductive element L2. As shown, a cathode of diode D2 is coupled to the return node 212, and a third inductor L3 is positioned between the node 1872 and the output node 210.

Figure 19:
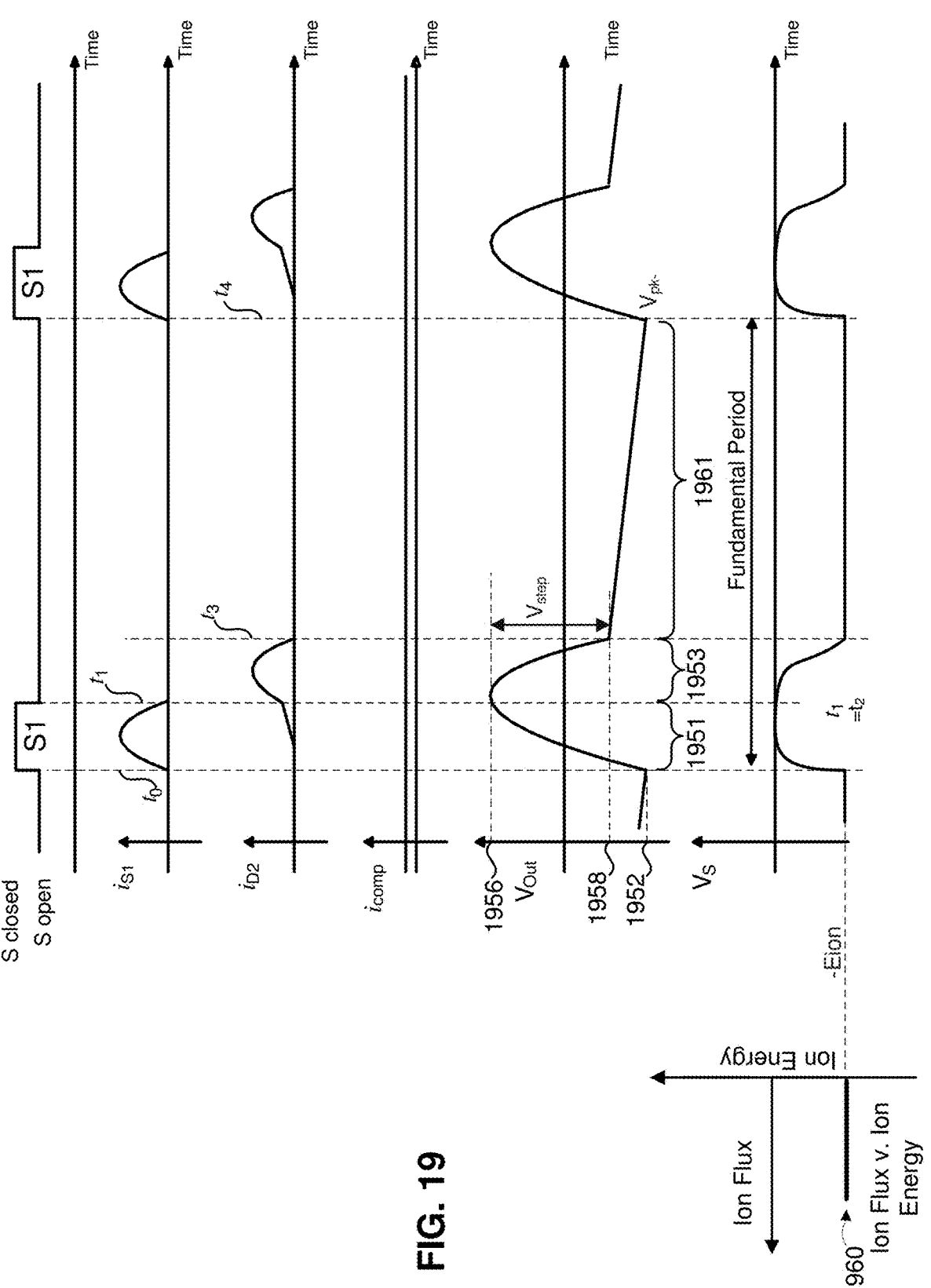
FIG. 19 depicts graphs and a timing diagram depicting aspects of a bias supply that comprises switch network depicted in FIG. 18C.

In operation, the switch S1 in switch network 1820C may be operated as shown in FIG. 19 to create a full cycle of the asymmetric periodic voltage waveform, $V_{out}$, between the output node 210 and the return node 212 from the time t0 to the time t4. Also depicted in FIG. 19 is a sheath voltage, Vs, that corresponds to the asymmetrical periodic voltage. As shown, the asymmetric periodic voltage waveform, $V_{out}$, achieves a sheath voltage, Vs, that is generally negative to attract ions to impact a surface of the workpiece to enable etching of the workpiece 103.

When the switch S1 is closed at a time to, the current pathway (comprising the switch S1, diode D1, and inductor L1) connects the return node 212 to the node 1872 and unidirectional current, iS1, begins to increase from zero current at the time, to, and the asymmetrical periodic voltage, $V_{out}$, (relative to the return node 212) applied at the output node 210 begins to move (over a first portion 1951 of the of the periodic voltage waveform) from a first negative voltage 1952 to a positive peak voltage 1956. As shown, the current, iS1, increases to a peak value and then decreases to zero at a time, t1, when the switch, S1, is opened. As shown, iD2, increases in a ramp-like manner while the switch S1 is closed so that the current iD2 is non-zero when the switch S1 is opened at the time, t1.

As depicted, when the current, iS1, through the first current pathway drops to zero and the switch S1 is opened, the asymmetric periodic voltage drops from the positive peak voltage 1956. And after the switch S1 is opened (during a second portion 1953 of the asymmetrical waveform), unidirectional current, iD2, increases through the second current pathway (through the second diode D2), peaks, and then drops to zero current flow from time t1 to a time t3. As shown, the increase and fall of the unidirectional current, iD2, occurs while the asymmetrical periodic voltage changes (during the second portion 1953) from the positive peak voltage 1956 to a third. negative, voltage level 1958. As depicted, during the time from t0 to t3, the first portion 1951 of the asymmetric periodic voltage causes the sheath voltage, Vs, to approach a positive voltage to repel positive charges (that accumulate on the surface of the workpiece while the surface of the workpiece is held at a negative voltage), and the second portion 1953 of the asymmetric periodic voltage causes the sheath voltage, Vs, to become a desired negative voltage (or range of voltages) to achieve an ion flux that achieves a desired ion energy value 1960.

As depicted, after the unidirectional current, iD2, rises and falls back to a level of zero current, the asymmetrical periodic voltage, $V_{out}$, becomes more negative (as a negative voltage ramp) during a third portion 1961 until the switch S1 is closed again at a time t4. As depicted, compensation current, $i_{comp}$, may be provided during a cycle of the asymmetric periodic voltage to compensate for ion current in the plasma chamber 101. For example, without the compensation current, $i_{comp}$, the sheath voltage, Vs, may gradually change to become more positive during the fourth portion of the asymmetric periodic voltage, which creates a broader distribution of ion energies, which may be undesirable. But in some variations, the compensation current, $i_{comp}$, may intentionally be set to overcompensate or undercompensate for ion current in the plasma chamber 101 to create a broader distribution of ion energies. In the mode of operation depicted in FIGS. 19, the compensation current, $i_{comp}$, provides a sheath voltage, Vs, that is substantially constant during the third portion of the asymmetrical periodic voltage, Vo.

It should be recognized that (because the switch S1 the diode D1 and the inductor L1 are arranged in series), the order in which the switch S1 the diode D1, and the inductor L1 are positioned (between the return node 212 and the node 1872 may be changed. In addition, the order in which L2 and D2 are arranged may be swapped.

To maintain a narrow ion energy distribution (IED) width, the switching frequency is increased at higher ion current and lower ion energy. Note that changing switching frequency also affects the ion energy (eV) level and requires adjustment of the first power supply 216 to keep a constant ion energy. A multiple input multiple output (MIMO) control system shown in FIG. 6 can still be implemented for this system configuration, where the control variables are $$\begin{bmatrix} \Delta Eion \\ Eion \end{bmatrix} \text{ or } \begin{bmatrix} Slope \\ Vstep \end{bmatrix} \text{ or } \begin{bmatrix} Ks \\ Vstep \end{bmatrix}$$

and two control knobs are $$\begin{bmatrix} fsw\_set \\ Vsupply\_set \end{bmatrix}.$$

Alternatively, as shown in FIG. 16, two separate single input single output (SISO) control loops are feasible, where fsw only controls ΔEion and the first power supply controls Eion. The two control loops may be decoupled by having different bandwidths. This can be realized by tuning PID compensator coefficients properly or setting the sampling rates of the two control loops differently. The latter option reduces computation effort in a digital control system.

In contrast to the second compensator 1132B (described with reference to FIG. 11) that produces a voltage-level signal, Vrail_set, FIG. 16 includes a second compensator 1632B that produces a frequency-control signal, $f_{sw.set1}$, in response to the second error signal, error2. As shown, the gate drive signal generator 636 uses the $f_{sw.set1}$ signal to control a fundamental frequency of the asymmetrical periodic voltage waveform during steady state operation within the various states the bis supply 108 may operate. FIG. 16 also depicts a transition control module 1634 that may be used to realize the transition control module 234 depicted in FIG. 2. The transition control module 1634 is configured to produce a transition-frequency control signal, $f_{sw.set0}$, to control the fundamental frequency of the asymmetrical periodic voltage waveform during transitions (using methodologies disclosed further herein) between the various steady states. As shown, a transition mode signal 1636 (e.g., from the bias control portion 232) triggers (e.g., in response to a state change) a transition switch 1638 to change between steady state control (using the second compensator 1632B) and a transition control (using the transition control module 1634). It should be recognized that the transition control module 1634 and transition switch 1638 may be realized as control logic that may be implemented by, for example and without limitation, hardware, a field programmable gate array, and/or firmware.

Referring back to FIGS. 6, 11, and 16, shown are block diagrams depicting aspects of sampling, readback, and control methods for the bias supply 208. An aspect of these methods comprises applying an asymmetric periodic voltage waveform $V_{out}$ (at the output node 210 relative to the return node 212) and providing a corresponding output current waveform $I_{out}$. Voltage and current signals indicative of the periodic voltage waveform and the corresponding current waveform are received and sampled (e.g., by the metrology component 620) to provide digital representations of the asymmetric periodic voltage waveform and the corresponding current waveform. The digital representations of the asymmetric periodic voltage waveform and the corresponding current waveform are processed (e.g., by the data processing module 630) to produce a first readback value indicative of ion energy and a second readback value indicative of an ion energy distribution. Depending upon the implementation, as described above, the data processing module 630 may provide parameter values utilized in one or more control loops to control desired attributes of, for example and without limitation, the asymmetric periodic voltage waveform, output current, ion energy, and ion energy distribution.

Figure 20:
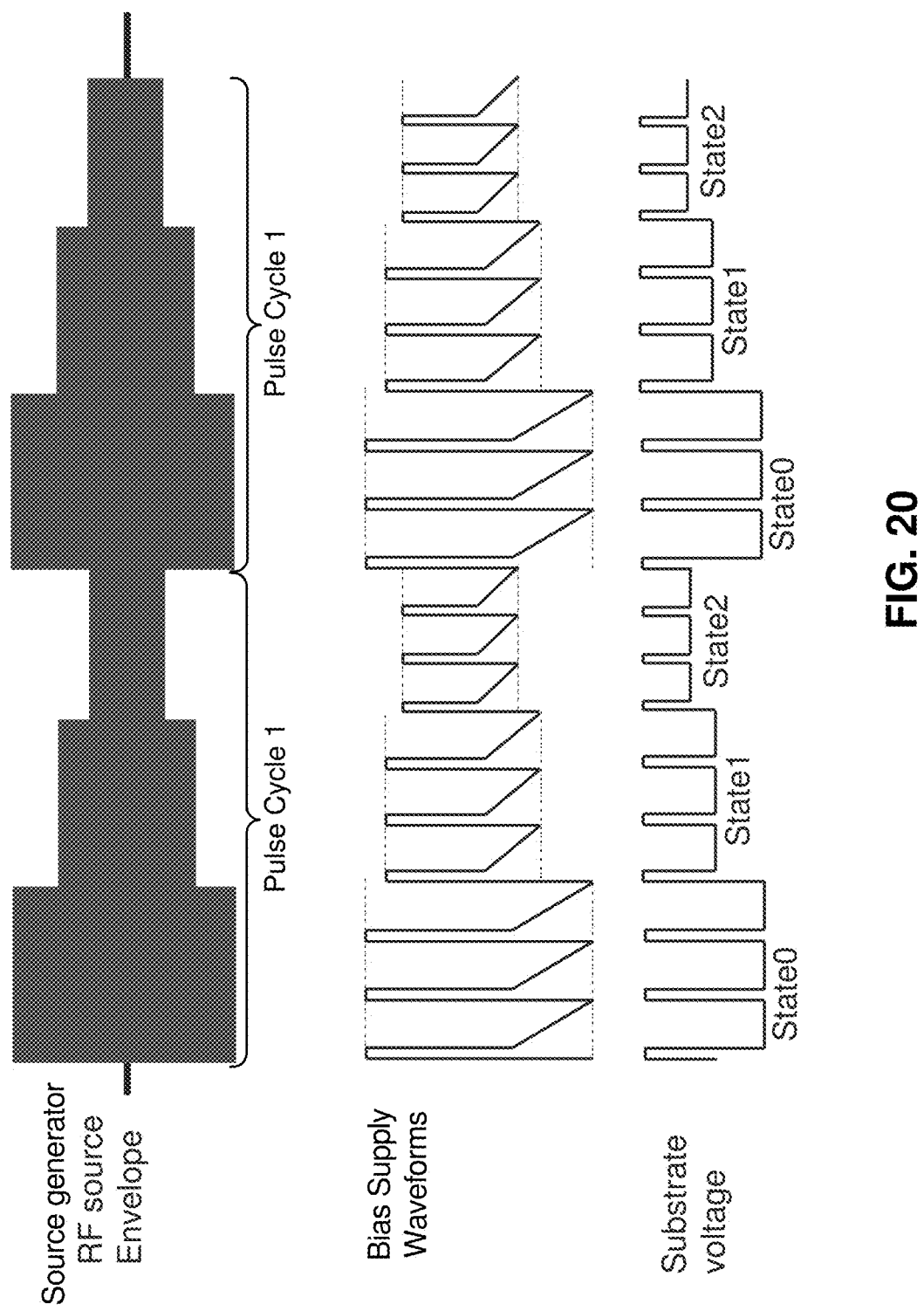
FIG. 20 is a diagram depicting graphs representing examples RF pulses of a source generator, multiple states of a bias supply, and corresponding substrate voltages.

Referring next to FIG. 20, shown are examples of RF source envelopes (that may be output from the source generator 112), example bias supply waveforms (that may be output by the bias supply 108) and example substrate voltages (that may be produced at the surface of the workpiece 103).

In some plasma processing recipes, it is desirable to provide a pulsed waveforms having multiple states (or power levels) as illustrated in FIG. 20. For example, a recipe may include a number of pulse cycles (PC) and a number of states per pulse cycle. As shown, the RF power output by the source generator 112 may change during each state according to a target power level for each state. In this example, two pulse cycles are shown where each pulse cycle includes three different states. As shown, the bias supply 108 may output multiple cycles of a periodic voltage waveform during each state, and the voltage levels of the periodic voltage waveform may change from state to state. In FIG. 20, the cycles of the periodic voltage waveform are depicted while the cycles of the source generator are not depicted because (typically) the frequency of the periodic voltage waveform is hundreds of kilohertz, and in contrast, the frequency of the source generator 112, which may be in the megahertz (e.g., 13.56 MHZ). As a consequence, the waveform of the source generator 112 is not shown in FIG. 20, and instead, envelopes corresponding to different power levels are shown.

It should be recognized that FIG. 20 merely depicts an example of state changes and that a variety of different power states may be applied according to a variety of different pulse cycles. For example, although the output of the bias supply 108 is shown changing when the source generator 112 changes states, it is certainly possible for the power level output by the source generator 112 to remain the same while the output of the bias supply 108 changes according to different states.

Applicant has found that, during a change from one state to another (e.g., when a setpoint of the bias supply 108 changes), there may be an undesirable transient overshoot and/or oscillations in both the inductor current, Ib, and output voltage, Vout, of the bias supply 108. The transient dynamic aspects originate from a resonance between the inductance 214 and a total capacitance (due to a chuck capacitance, Cch, a sheath capacitance, Cs), and stray capacitance (Cstray0+Cstray1) at the output node 210. The output voltage overshoot is associated with the inductance current, Ib, overshoot (through inductance 214). The transient aspects may occur in the context of multilevel pulsing (such as is shown in FIG. 20) or may occur during any single-event state change.

Figure 22:
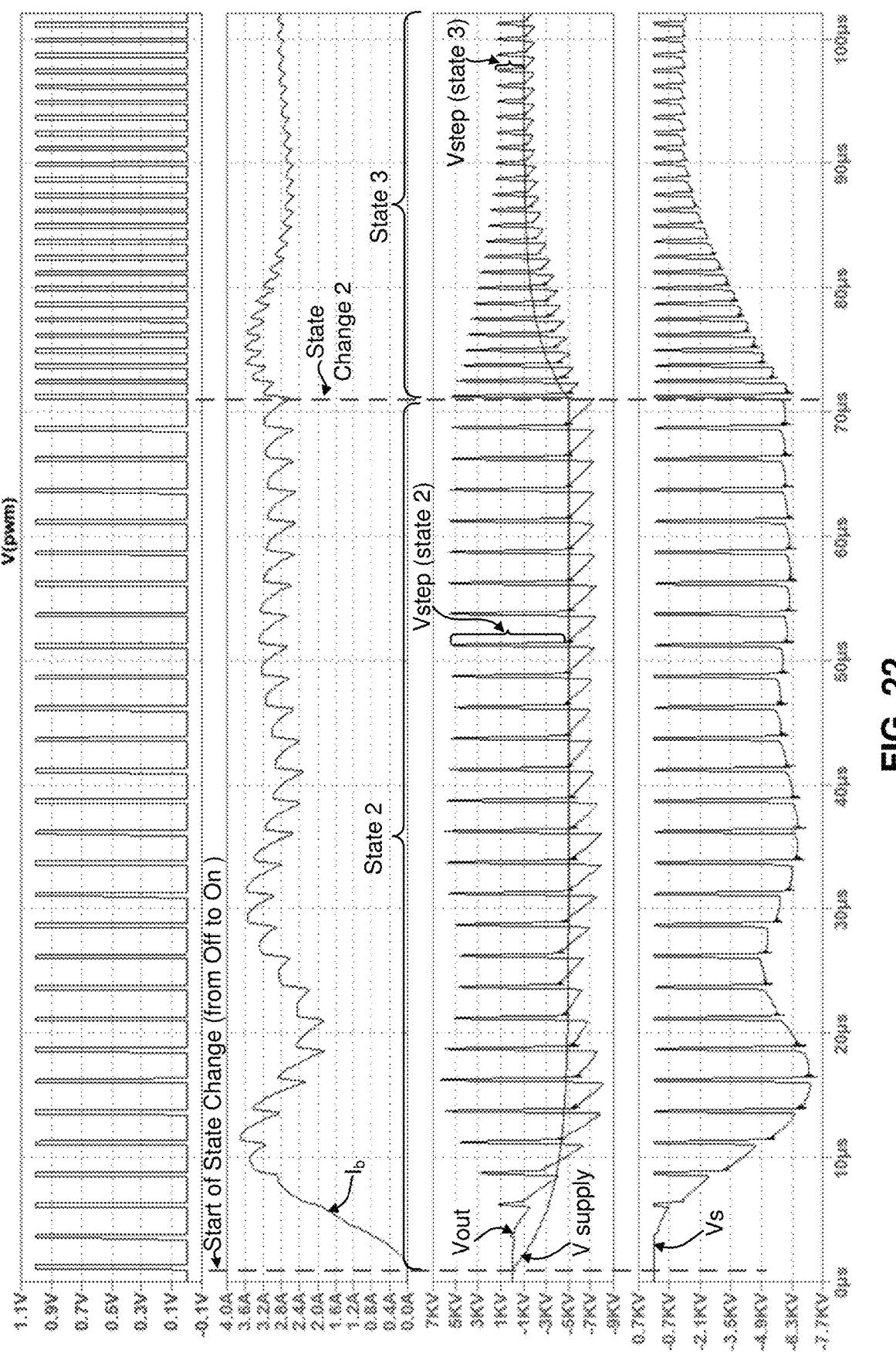
FIG. 22 depicts multiple waveforms resulting from control of a bias supply across state changes without transition control.
Figure 23:
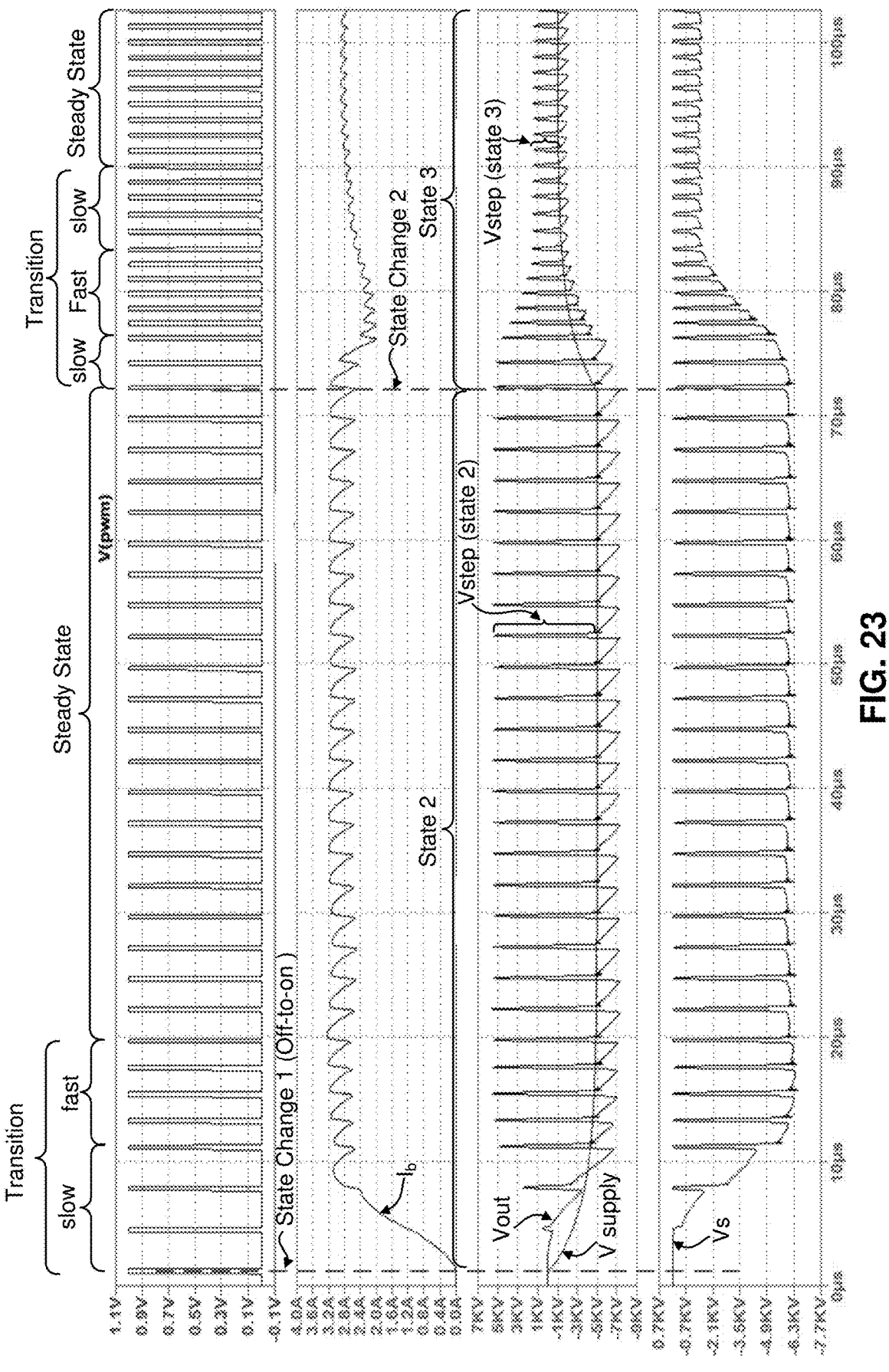
FIG. 23 depicts multiple waveforms resulting from control of a bias supply across state changes with transition control.

Referring briefly to FIGS. 22 and 23 for example, shown are graphs depicting three example operational states: an off state (before about 2 microseconds), a second state (state 2), and a third state (state 3). The depicted states and transition controls (described with reference to FIG. 23) are examples only and other state combinations and transition controls are certainly contemplated. FIG. 22 depicts operation of the bias supply 108 without transition control and FIG. 23 depicts examples of transition control that may be used when the bias supply 108 changes states. As shown, FIGS. 22 and 23 depict pulse-width-modulated (PWM) signals; the current, Ib, through the inductance 214; the voltage, Vout, at the output node 210; and the sheath voltage, Vs, between the plasma 102 and a surface of the workpiece 103.

As shown in FIG. 22, without transition control, after a first state change (at about 2 microseconds) from the off state to the second state, there are transient oscillations in the inductance current, Ib, the output voltage, Vout, and the sheath voltage, Vs, that last for over 60 microseconds. Because the sheath voltage affects the energy of ions impacting the surface of the workpiece 103 (i.e., the sheath voltage affects the ion energy distribution), the transient overshoot and oscillations may adversely affect the processing of the workpiece 103.

Applicant has found that changing the fundamental frequency of the asymmetrical periodic voltage waveform during transitions between one state to another state may be used to mitigate output overshoot of the output voltage, Vout. Consistent with embodiments disclosed herein, switching frequency may be used to adjust the fundamental frequency of the asymmetrical periodic voltage waveform. For example, a lower fundamental frequency (e.g., produced by a lower switching frequency, fsw) results in less voltage across the inductance 214, which suppresses the current, Ib, and voltage overshoot. To enable transition control, the transition control module 234 depicted in FIG. 2 and the transition control module 1623 are configured to adjust the fundamental frequency of the asymmetrical periodic voltage waveform to mitigate against undesired oscillations (e.g., in $I_b$ and Vout) and/or to effectuate a desired response time to achieve a desired voltage at $V_{out}$ (e.g., a desired time to achieve a desired Vstep).

The PWM signals may be voltage pulses (that rise to exceed 0.9 volts), which are used to close the switches that are described herein. It is also contemplated that PWM optical pulses may be utilized to control optically-activated switches. And a period of the pulses (the time is takes for a cycle of the PWM signal to repeat) may be modulated to change the switching frequency. It should be recognized that the particular PWM signals depicted in FIG. 22 correspond to gate drive signals for the single-switch embodiments (e.g., described with reference to FIG. 5 and FIG. 19), but the fundamental period of a switching cycle in two-switch embodiments (e.g., shown in FIG. 4) may be changed (e.g., the time between t0 and t4 may be changed in the timing diagram depicted in FIG. 4). It should also be recognized that, as shown in FIG. 22 (and previously described with reference to FIGS. 16 and 17), the fundamental frequency of the asymmetrical periodic voltage waveform may vary between steady state portions of different states to achieve a desired ion energy value, Eion, and a desired ion energy distribution, ΔEion. But changing the fundamental frequency of the asymmetrical periodic voltage waveform from steady state operation to steady state operation is different than the transition control wherein the fundamental frequency during transition is neither the fundamental frequency of a current state nor is it the fundamental frequency of a next state.

Referring next to FIG. 21, it is a flowchart depicting a transition control method that may be traversed in connection with embodiments disclosed herein. As shown, an asymmetric periodic voltage waveform is applied and a corresponding current waveform is provided (Block 2102), and when a signal is received to change from a current (i.e., a present) state of the asymmetric periodic voltage waveform to a next state of the asymmetric periodic voltage waveform (Block 2104), at least one of the first, second, and third portions of the asymmetric periodic voltage waveform is adjusted (e.g., by adjusting the first power supply (also referred to as Vsupply)), and simultaneously, an adjustment is made to a fundamental frequency of the asymmetric periodic voltage waveform to settle at the next state (Block 2106). As discussed above, the fundamental frequency during the transition is different than the fundamental frequency during either the current or next state.

Examples and benefits of the transition control method are shown in FIG. 23. The steady state settings that produce the waveforms in FIG. 23 are the same as the steady state settings that produce the waveforms in FIG. 22. And yet, the inductance current, Ib, (through the inductance 214), the voltage, Vout, and the sheath voltage, Vs, in FIG. 23 are very different under the transition control. It should be recognized that FIG. 23 is only an example of the types of events that may be experienced by the bias supply and that the transition control at Block 2106 is also applicable to any single-event state change such as, for example, the bias supply 108 changing from an off state to an on state.

For example, in contrast to the substantial transient oscillations in the inductance current, Ib, the output voltage Vout, and the sheath voltage, Vs, that occur (without transition control) after the first state change and last for over 60 microseconds, the inductance current, Ib, the output voltage Vout, and the sheath voltage, Vs, under transition control completely settle by about 40 microseconds with a much smaller swing during the oscillations. As shown in FIG. 23, after a signal indicating a state change occurs at about 2 microseconds, the voltage, Vsupply, applied by the second power supply begins to change, but in contrast to the control approach depicted in FIG. 22 (which starts to apply the steady state fundamental frequency of asymmetric periodic voltage waveform immediately after the state change signal), in FIG. 23, three PWM signals are applied from about 2 microseconds to about twelve microseconds at a longer fundamental frequency (longer than the steady state fundamental frequency for the second state) and then four PWM signals are applied from about 12 microseconds to about 19 microseconds at a faster fundamental frequency (faster than the steady state fundamental frequency for the second state) before the asymmetric periodic voltage waveform is applied as the steady state fundamental frequency at about 19 microseconds.

FIG. 23 also depicts another advantage of transition control—the ability to arrive at a desired Vstep voltage more quickly. More specifically, when a state change signal is received, which triggers the second state change at about 73 microseconds, a lower fundamental frequency (lower than a steady state fundamental frequency for the third state) is utilized for two cycles to effectuate a lower voltage across the inductance 214, which results in a lower level of current, Ib (during the first 10 microseconds after the second state change), and a lower output voltage, Vout (relative to the same time frame depicted in FIG. 22). More specifically, when a signal is received triggering the second state change at about 73 microseconds, without transition control, the asymmetric periodic voltage waveform at Vout settles to a desired level for Vstep after about 98 microseconds. But with the transition control, the desired level of Vstep is achieved at about 92 microseconds.

From an operator's perspective (e.g., when an operator is carrying out a recipe), state changes may be thought of (and controlled) in terms of ion energy (and/or ion energy distribution), but ion energy is determined by the substrate voltage (which may be characterized in terms of sheath voltage), and substrate voltage (also referred to as wafer voltage) is determined by the asymmetric periodic voltage waveform. So, state changes may also be viewed in terms of changes to the asymmetric periodic voltage waveform. For example, a change to Vstep (shown in FIGS. 4 and 5) may be used to effectuate a state change in ion energy, and Vstep may be adjusted by adjusting the second portion of the asymmetric periodic voltage waveform (from t2 to t3 in FIG. 4). And as described with reference to FIG. 12, the first power supply 216 (also referred to herein as Vsupply) may be used to change the first, second, and third portions of the asymmetric periodic voltage waveform.

The adjustment to the fundamental frequency of the asymmetric periodic voltage waveform (at Block 2106) may be made to settle at the next state after a predefined transition time using a predefined transition type, and the transition time and/or a transition type may be established, as discussed further herein, in a lookup table.

Figures 24A, 24B:
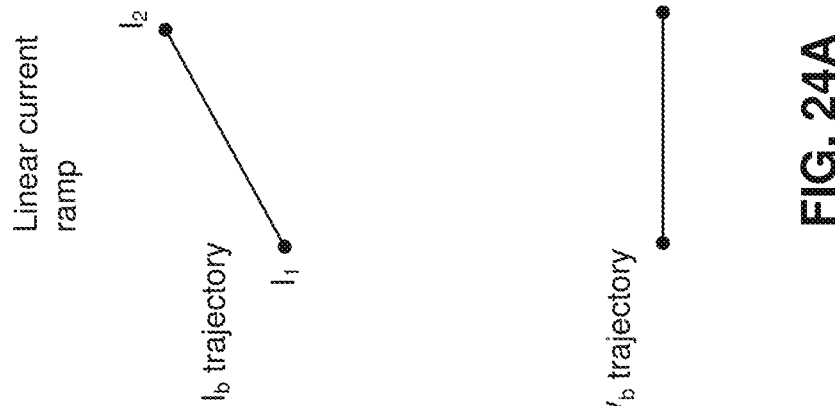

Referring to FIGS. 24A to 24B, shown are examples of the current, Ib, though the inductance 214 and the corresponding voltage, Vb, across the inductance that may be achieved by changing the fundamental frequency of the asymmetric periodic voltage waveform during a transition from one state to another state. FIG. 24A depicts a linear current ramp trajectory and a corresponding flat trajectory for the inductance voltage, Vb. FIG. 24B depicts an exponentially-decaying current curve and a corresponding trajectory of the inductance voltage, Vb. FIG. 24C depicts a concave parabolic current curve that may be used for the inductance current, Ib, to produce a decreasing ramp voltage for the inductance voltage, Vb. FIG. 24D depicts an overshoot trajectory for the inductance current, Ib, and the corresponding trajectory for the inductance voltage, Vb. And FIG. 24E depicts an undershoot waveform for the inductance current, Ib, and the corresponding inductance voltage, Vb.

Figure 25:
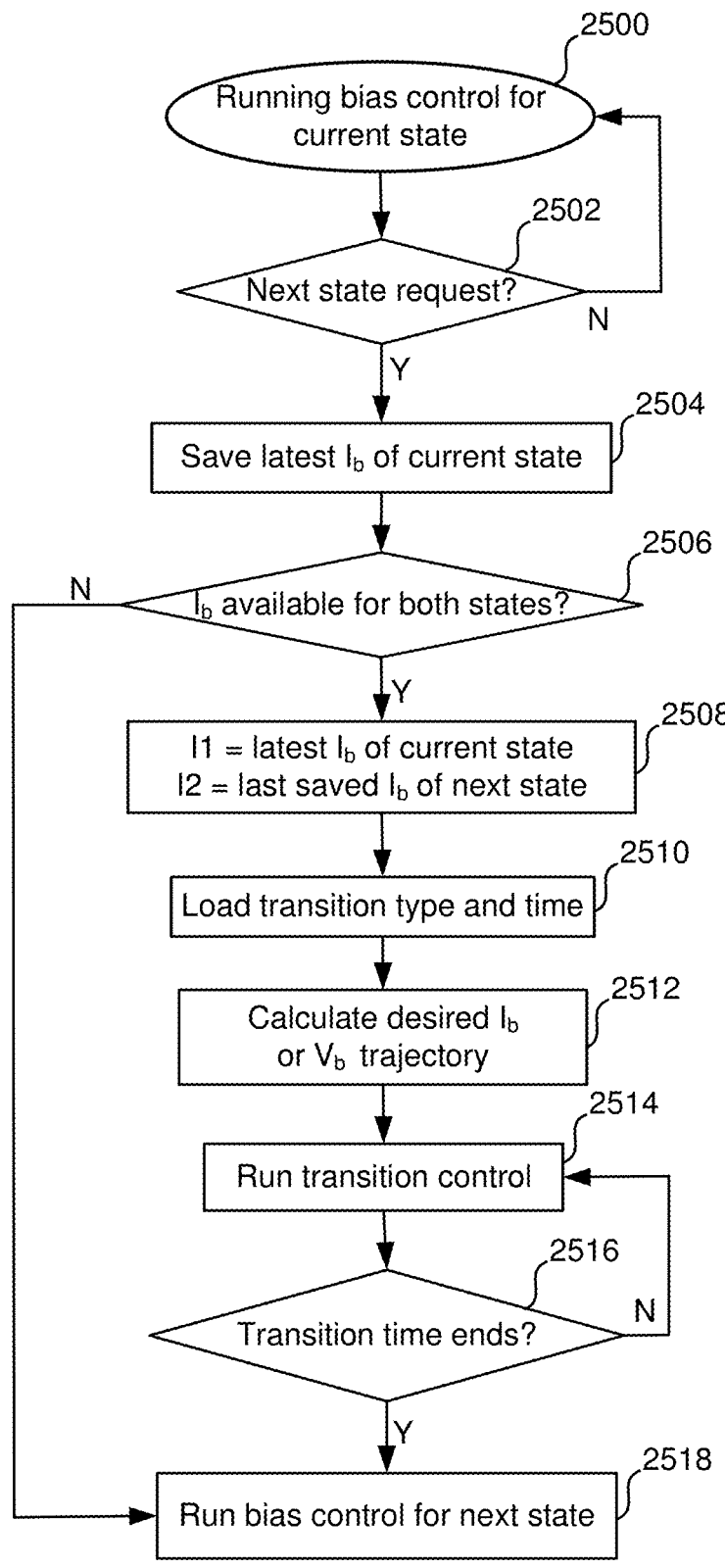
FIG. 25 is a flowchart depicting another method that may be traversed to control a bias supply.

Referring next to FIG. 25, shown is a variation of the method described with reference to FIG. 21 in which inductance current, Ib, or inductor voltage, Vb, in connection with a transition type and time, are utilized to control the fundamental frequency of the asymmetrical voltage waveform at Vout. As shown, the bias supply 108 runs a bias control for a current state (Block 2500) until a next state is requested (Block 2502), and once the next state is requested (at Block 2502) the latest value of the inductance current, Ib, is saved (Block 2504). If the inductance current, Ib, is not available for both states (Block 2506), then the bias control for the next state is run (Block 2518).

But if the inductance current, Ib, is available for both states (Block 2506), then a variable, I1, is set to equal the latest value for the inductance current of the current state and another variable 12 is set to equal a last saved value for the inductance current of the next state (Block 2508). Then the transition type (e.g., any of the transition types depicted in FIGS. 24A-24E) is loaded along with a time for the transition (Block 2510), and a desired inductance current, Ib, or inductance voltage, Vb, is calculated (Block 2512), and used to run the transition control (Block 2514) to determine the fundamental frequency of the asymmetrical voltage waveform until the transition time ends (Block 2516), and once the transition time ends (at Block 2516), the steady state bias control for the next state is used to control the bias supply 108 (Block 2518). The transition control at Block 2514 may be run according to different methods including, without limitation, a bang-bang control method (as described, e.g., with reference to FIGS. 26 and 27); a proportional integral derivative (PID) compensator method (as described, e.g., with reference to FIGS. 27 and 28); and a look-up table method (as described, e.g., with reference to FIG. 30).

Figures 26, 27:
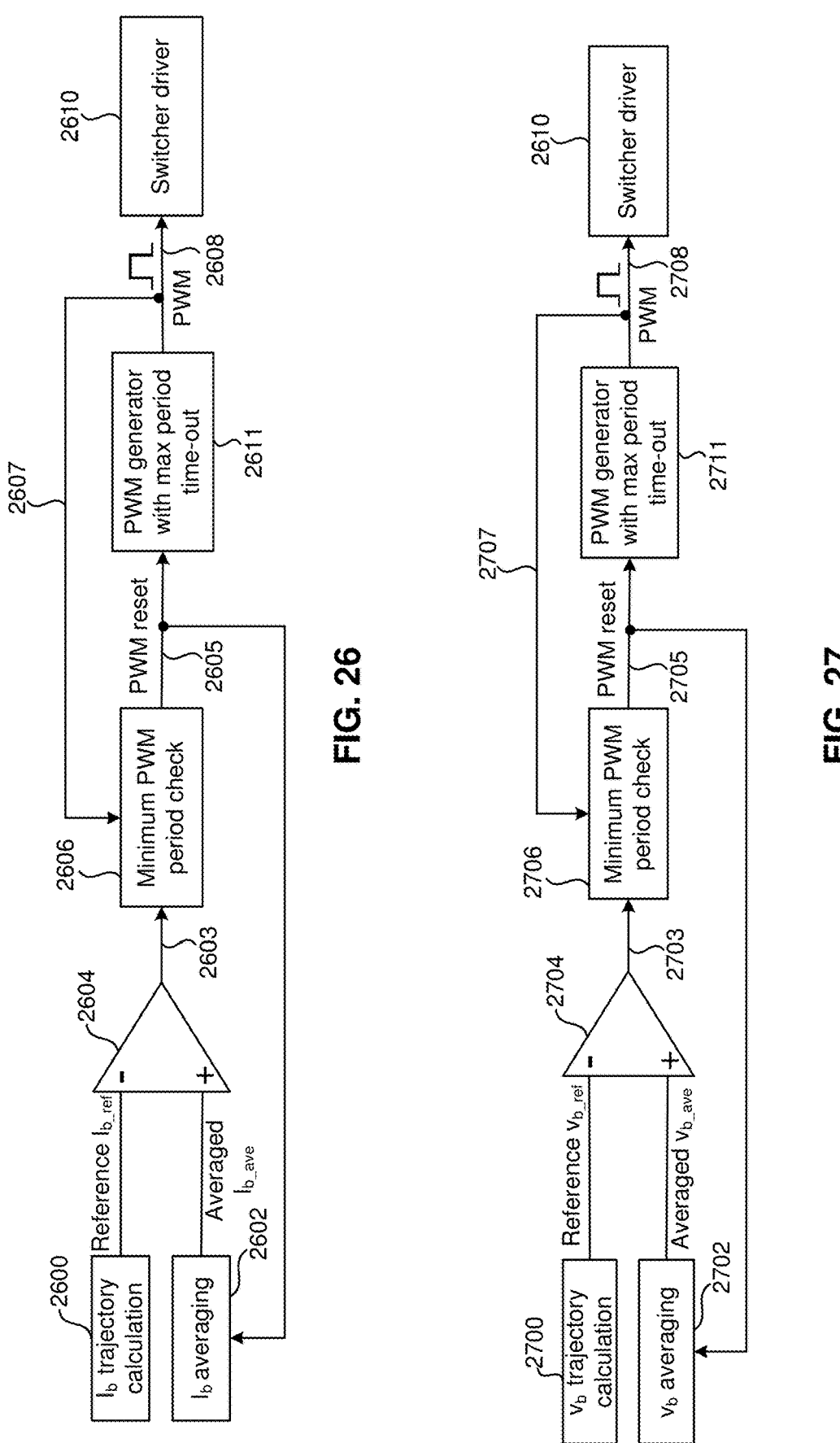
FIG. 26 is a flow diagram depicting an example method for carrying out the transition control of FIG. 25.
FIG. 27 is another flow diagram depicting an example method for carrying out the transition control of FIG. 25.

Referring to FIG. 26 for example, shown is a method for carrying out the transition control (at Block 2514) according to a bang-bang method using current sensing to obtain the inductance current, Ib. In this method, a desired trajectory for the inductance current, Ib, is calculated to produce a reference current value, Ib_ref (Block 2600), and an average of the inductance current, Ib_ave, is obtained (Block 2602). As shown, the average of the inductance current, Ib_ave is obtained during a time window set by a PWM reset signal 2605. As shown, a difference value 2603 that represents a difference between the reference current value, Ib_ref and the average inductance current, Ib_ave is obtained (Block 2604), and then a minimum PWM period check is performed to create the PWM reset signal 2605 using the difference value 2603 and feedback 2607 of the actual PWM signal 2608 (Block 2606). The PWM reset signal 2605 is used to generate the PWM signal 2608 with a maximum period timeout (Block 2611). And the PWM signal 2608 is used by a switcher driver 2610 to provide switching signals to one or more switches to adjust the fundamental frequency of the asymmetric periodic voltage waveform.

Referring next to FIG. 27, shown is another method for carrying out the transition control (at Block 2514) according to a bang-bang method using sensing of the inductor voltage, Vb. In this method, a desired trajectory for the inductance voltage, Vb, is calculated to produce a reference voltage value, Vb_ref (Block 2700), and an average of the inductance voltage, Vb_ave, is obtained (Block 2702). The trajectory of Vb may be obtained based upon a predefined shape or based on $I_b$ trajectory, wherein $V_b = L_b \, di_b/dt$. As shown, the average of the inductance voltage, Vb_ave is obtained during a time window set by a PWM reset signal 2705 (the averaging at 2702 is reset at the beginning of each PWM cycle). The sensing to obtain the voltage, Vb, across the inductance may be done directly or indirectly using Vb=Vout−Vs (where Vs is the sheath voltage). As shown, a difference value 2703 between the reference voltage value, Vb_ref and the average inductance voltage, Vb_ave is obtained (Block 2704), and then a minimum PWM period check is performed to create the PWM reset signal 2705 using the difference value 2703 and feedback 2707 of the actual PWM signal 2708 (Block 2706). The PWM reset signal 2705 is used to generate the PWM signal 2708 with a maximum period timeout (Block 2711). And the PWM signal 2708 is used by a switcher driver 2710 to provide switching signals to one or more switches to adjust the fundamental frequency of the asymmetric periodic voltage waveform.

Figures 28, 29:
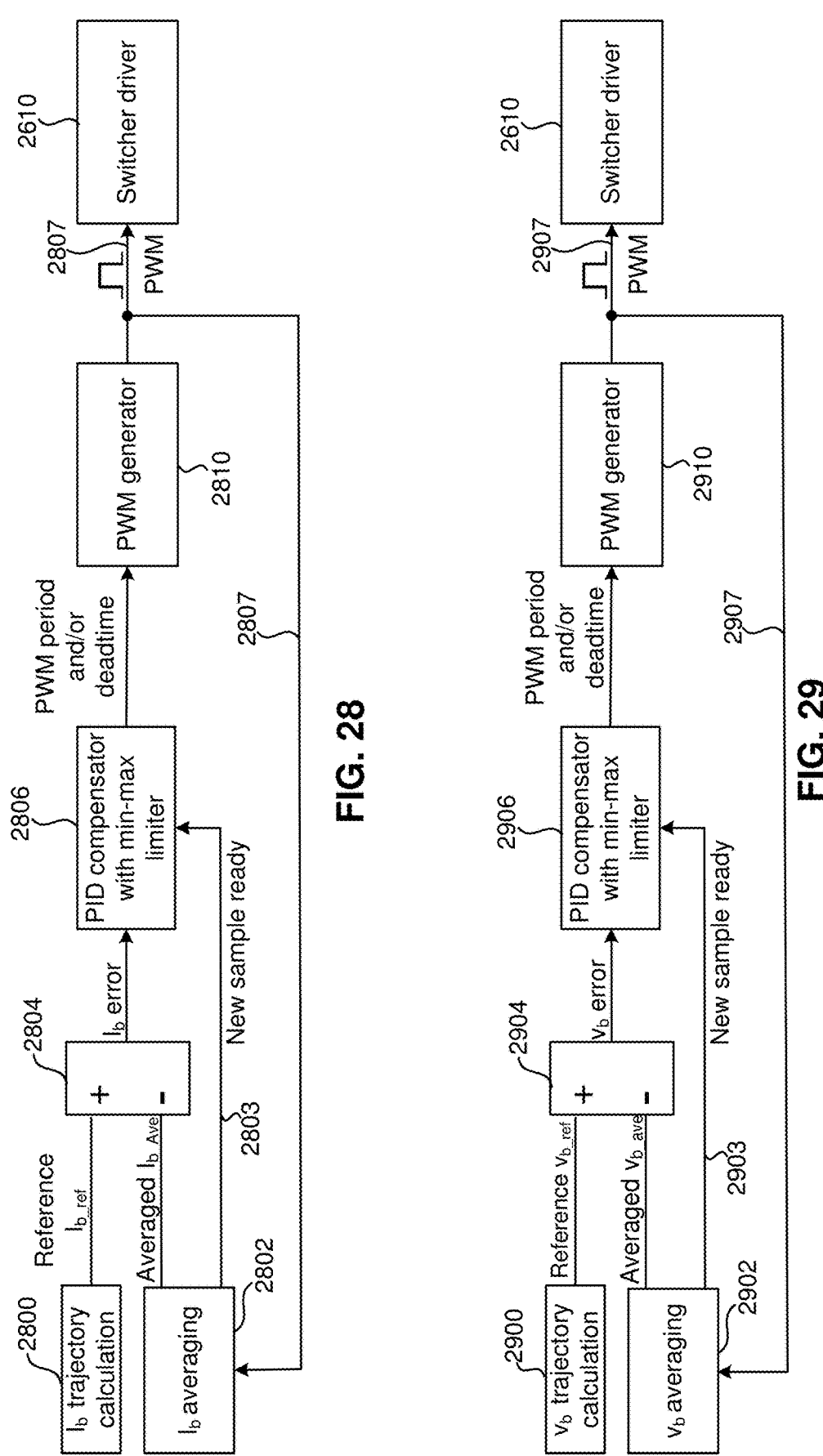
FIG. 28 is a flow diagram depicting yet another example method for carrying out the transition control of FIG. 25.
FIG. 29 is a flow diagram depicting an example still another method for carrying out the transition control of FIG. 25.

Referring next to FIGS. 28 and 29, shown are additional methods for carrying out the transition control (at Block 2514) according to a proportional integral derivative (PID) compensator method that covers the integrator only and proportional aspects only, PI and PID. Unlike a conventional PID controller with fixed sampling rate, the PID compensation methods described with reference to FIGS. 28 and 29 execute every PWM cycle and the cycle period varies. In these methods, compensator coefficients can be constant or a function of the PWM cycle.

In the method depicted in FIG. 28, a desired trajectory for the inductance current, Ib, is calculated to produce a reference current value, Ib_ref (Block 2800), and an average of the inductance current, Ib_ave is obtained (Block 2802). The average of the inductance current, Ib_ave is obtained during a time window set by the PWM signal 2807. As shown, an Ib error value indicative of a difference between the reference current value, Ib_ref, and the average inductance current, Ib_ave is obtained (Block 2804), and then PID compensation with a minimum and maximum limitation is carried out using the Ib error value and a sample ready signal 2803 (Block 2806). As shown, the PID compensation with the minimum and maximum limitation may produce with a PWM period value or a deadtime value, which may be used to generate the PWM signal (Block 2810). The deadtime value may be used in the context of 2-switch embodiments such as is shown in FIG. 4. The PWM period value may be used in connection with 1-switch and 2-switch embodiments and is depicted in FIGS. 4 and 5 as the fundamental period. The PWM signal 2807 is used by the switcher driver 2610 to provide switching signals to one or more switches to adjust the fundamental frequency of the asymmetric periodic voltage waveform.

Referring to FIG. 29, a desired trajectory for the inductance voltage, Vb, is obtained to produce a reference voltage value, Vb_ref (Block 2900), and an average of the inductance voltage, Vb_ave is obtained (Block 2902). The average of the inductance voltage, Vb_ave is obtained during a time window set by the PWM signal 2907. As shown, a Vb error value indicative of a difference between the reference voltage value, Vb_ref, and the average voltage current, Vb_ave is obtained (Block 2904), and then PID compensation with a minimum and maximum limitation is carried out using the Vb error value and a sample ready signal 2903 (Block 2906). As shown, the PID compensation with the minimum and maximum limitation may produce with a PWM period value or a deadtime value, which may be used to generate the PWM signal (Block 2910). The deadtime value may be used in the context of 2-switch embodiments such as is shown in FIG. 4. The PWM period value may be used in connection with 1-switch and 2-switch embodiments and is depicted in FIGS. 4 and 5 as the fundamental period. The PWM signal 2907 is used by the switcher driver 2610 to provide switching signals to one or more switches to adjust the fundamental frequency of the asymmetric periodic voltage waveform.

Figure 30:
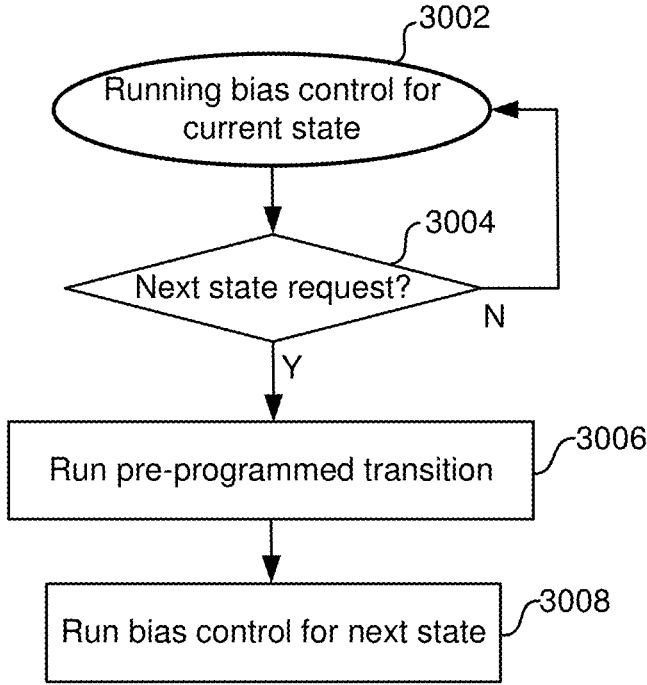
FIG. 30 is a flowchart depicting a method for carrying out transition control using a lookup table.

Referring next to FIG. 30, shown is a flowchart depicting a method for carrying out the transition control (at Block 2514) according to a lookup table approach. As shown, the bias supply 108 may run bias control for a current state (Block 3002) until a next state is requested (Block 3004), and once a new state is requested (at Block 3004) a pre-programmed transition is run (Block 3006), and when the transition is complete, bias control for the next state is run (Block 3008). The preprogrammed transition may be run utilizing a lookup table that, in general, provides data that can be used to set the fundamental frequency in connection with a quantity of cycles for each fundamental frequency setting.

For example, FIG. 31 shows an example lookup table that may be used to define a preprogrammed transition for one or more state changes. In general, the lookup table may define a transition in terms of a waveform timing parameter (that relates to the fundamental period of the asymmetrical voltage waveform) and a number of cycles. Examples of waveform timing parameters include, without limitation, $t_{ramp}$ and $t_{reset}$ (both $t_{ramp}$ and $t_{reset}$ are depicted and described with reference to FIGS. 4 and 5); a PWM period (depicted as the fundamental period in FIGS. 4 and 5); and deadtime (which is depicted and described with reference to FIG. 4). As shown in FIG. 31, a PWM period is utilized as the example waveform timing parameter, and for each PWM period value, there is a corresponding number of PWM cycles. More specifically, during a transition from State 0 to State 1, a PWM period of T01 is used for N_01 PWM cycles, a PWM period of T_02 is used for N_02 PWM cycles, and any number of waveform timing values up to T_0M (that each have a corresponding number PWM cycles) may be used.

Figure 32:
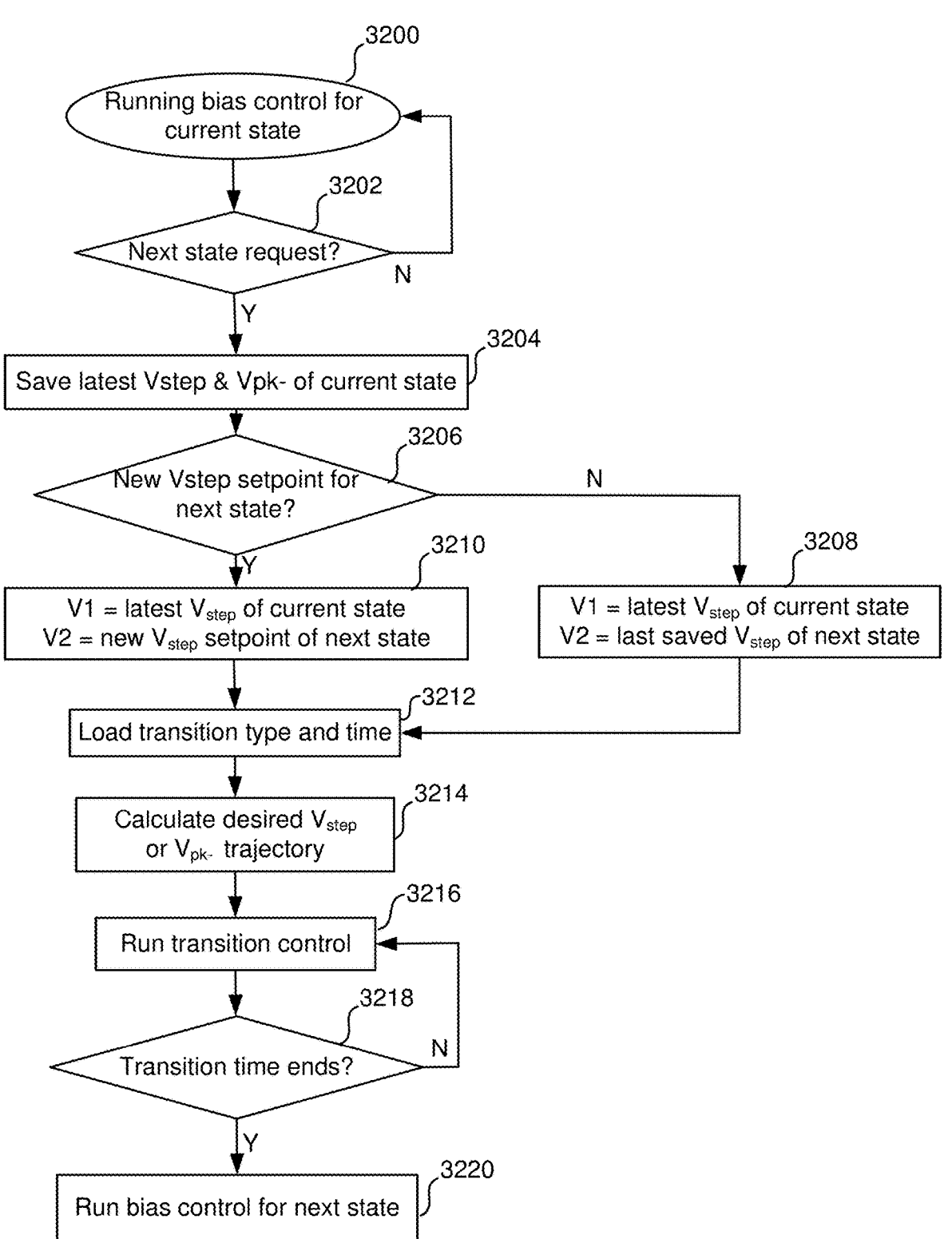
FIG. 32 is a flowchart depicting a method that may be traversed using a step voltage.

Referring next to FIG. 32, shown is a flowchart depicting a method that is a variation of the method described with reference to FIG. 21 in which state transition control is based upon Vstep or Vpk–. Both Vstep and Vpk– are described with reference to FIGS. 4 and 5. As shown, the bias supply 108 runs a bias control for a current state (Block 3200) until a next state is requested (Block 3202), and once the next state is requested (at Block 3202), the latest values of Vstep and Vpk– are saved (Block 3204). As shown, if the next state does not include a new Vstep (Block 3206), then a variable, V1, is set to the latest value for Vstep (of the current state) and a variable V2 is a set to the latest value for the last saved Vstep (of the next state) (Block 3208), and then the transition type and time is loaded (Block 3212). If the next state does include a new Vstep, then V1 is set to the latest value for Vstep (of the current state) and V2 is a set to the new value for Vstep (Block 3210), and then the transition type and time is loaded (Block 3212). Then either a desired Vstep or a desired value for Vpk– is calculated (Block 3214) before running transition control (Block 3216) until the transition time ends (Block 3218). Once the transition time ends, then bias control for the next state is run (Block 3220).

Figures 33, 34:
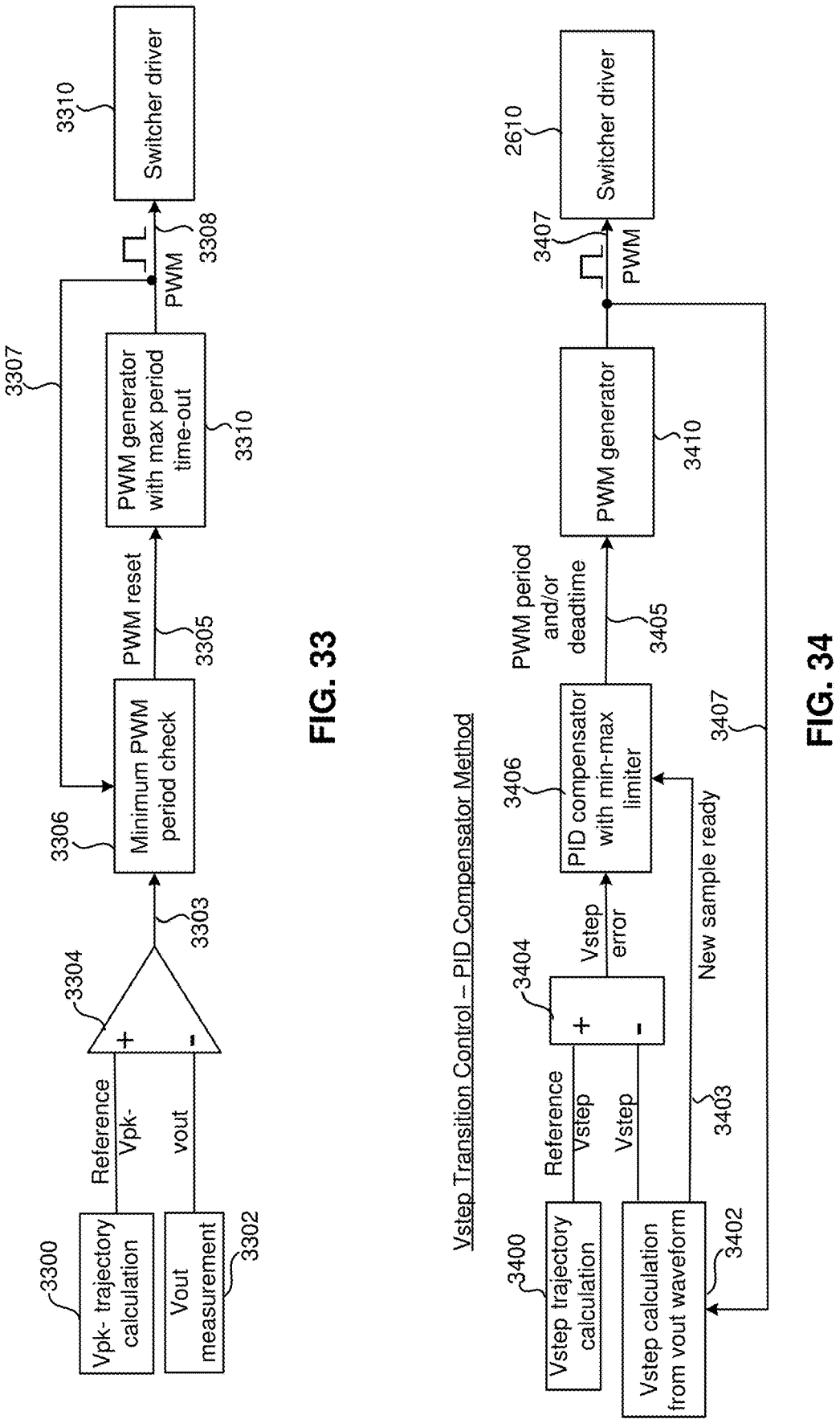
FIG. 33 is a flow diagram depicting an example method for carrying out the transition control of FIG. 32.
FIG. 34 is a flow diagram depicting another example method for carrying out the transition control of FIG. 32.

Referring next to FIG. 33, shown is a flowchart depicting an example of a method to carry out the transition control (at Block 3216) according to a bang-bang method. In this method, a desired trajectory for the Vpk– is calculated to produce a reference Vpk– value (Block 3300), and a measurement of Vout is obtained (Block 3302). As shown, a difference value 3303 indicative of a difference between the reference Vpk– value and Vout is obtained (Block 3304), and then a minimum PWM period check is performed (Block 3306) to create a PWM reset signal 3305 using the difference value 3303 and feedback 3307 of the actual PWM signal 3308. The PWM reset signal 3305 is used to generate the PWM signal 3308 with a maximum period timeout (Block 3310). And the PWM signal 3308 is used by the switcher driver 2610 to provide switching signals to one or more switches to adjust the fundamental frequency of the asymmetric periodic voltage waveform. The Vpk– trajectory calculation may include obtaining a predefined shape, or may be based on Vstep trajectory where Vpk–~Vstep (1.5-2Kc) and where $$K_c = \frac{C_{str} + \dfrac{C_{ch} C_{sh}}{C_{ch} + C_{sh}}}{C_{str} + C_{ch}}.$$

Referring to FIG. 34, shown is a flow diagram of another example of a method to carry out the transition control (at Block 3216) according to a PID compensator method. As shown, a Vstep trajectory calculation is performed to produce a reference Vstep value (Block 3400), and a calculation to obtain Vstep from Vout is performed (Block 3402). The calculation to obtain Vstep from Vout is performed during a time window set by a PWM signal 3407. As shown, a Vstep error value indicative of a difference between the reference Vstep value and the calculated value for Vstep is obtained (Block 3404), and then PID compensation with a minimum and maximum limitation is carried out using the Vstep error value and a sample ready signal 3403 (Block 3406). As shown, the PID compensation with the minimum and maximum limitation may produce with a PWM period value or a deadtime value 3405, which may be used to generate the PWM signal (Block 3410). The deadtime value may be used in the context of 2-switch embodiments such as is shown in FIG. 4. The PWM period value may be used in connection with 1-switch and 2-switch embodiments and the PWM period is depicted in FIGS. 4 and 5 as the fundamental period. The PWM signal 3407 is used by the switcher driver 2610 to provide switching signals to one or more switches to adjust the fundamental frequency of the asymmetric periodic voltage waveform.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

Figure 35:
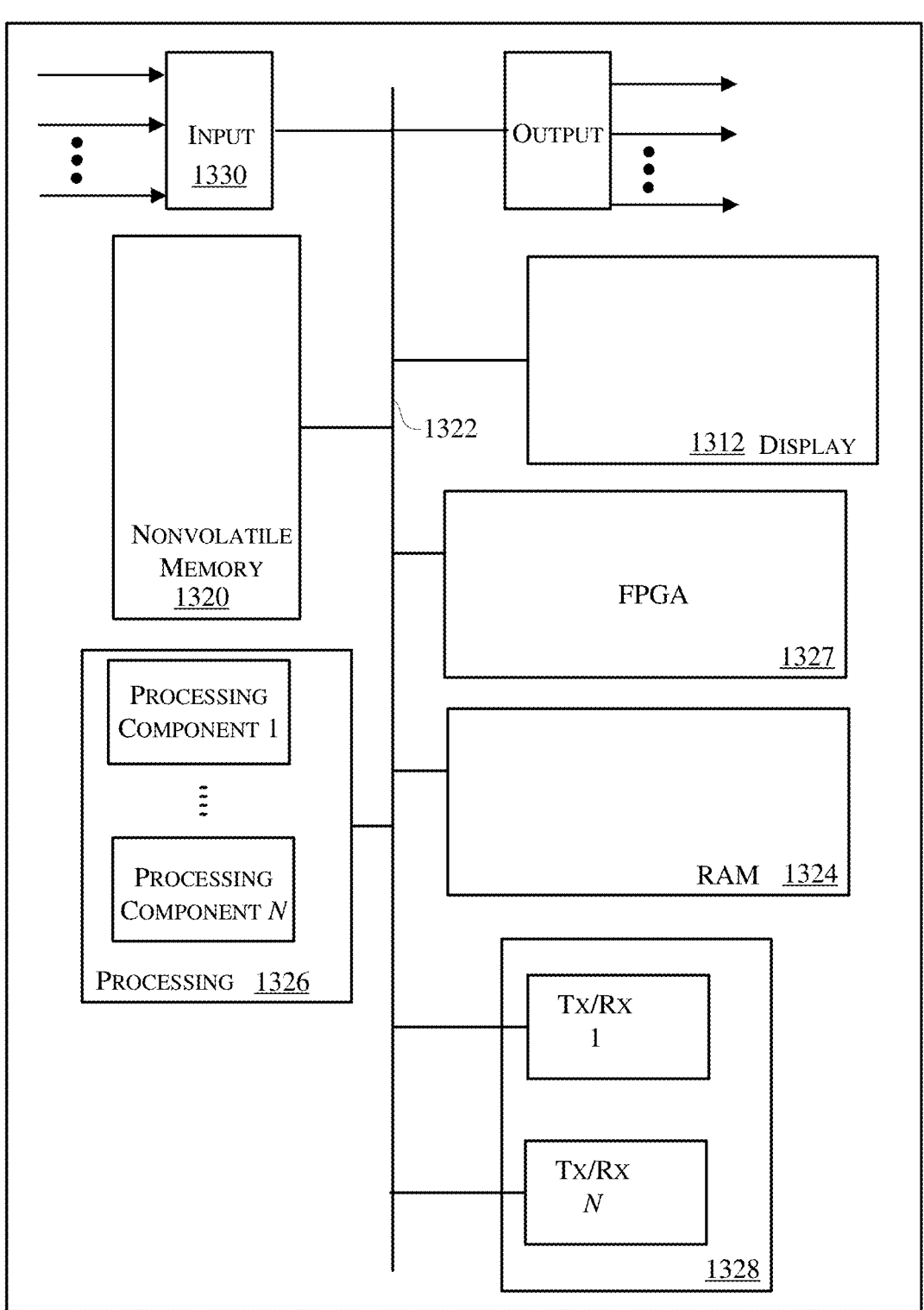
FIG. 35 is a diagram depicting components that may be utilized to implement control aspects disclosed herein.

Many embodiments and methods described herein may be realized using a processor in connection with processor executable instructions and a field programmable gate array (programmed by hardware description language instructions). The nonvolatile memory may be encoded with instructions that are executable by a processor and/or are readable by a field programmable gate array, e.g., to program the field programmable gate array. In some embodiments, the FPGA is used for high-speed processing and control, including switching control, measurement, pulsing, and multi-level operation while a processor is utilized for other lower-speed processing. Referring to FIG. 35 for example, shown is a block diagram depicting physical components of a controller that may be utilized to realize control aspects disclosed herein.

As shown, in this embodiment a display 1312 and non-volatile memory 1320 are coupled to a bus 1322 that is also coupled to random access memory ("RAM") 1324, a processing portion (which includes N processing components) 1326, a field programmable gate array (FPGA) 1327, and a transceiver component 1328 that includes N transceivers. Although the components depicted in FIG. 20 represent physical components, FIG. 20 is not intended to be a detailed hardware diagram; thus, many of the components depicted in FIG. 20 may be realized by common constructs or distributed among additional physical components. Moreover, it is contemplated that other existing and yet-to-be developed physical components and architectures may be utilized to implement the functional components described with reference to FIG. 20.

This display 1312 generally operates to provide a user interface for a user, and in several implementations, the display is realized by a touchscreen display. In general, the nonvolatile memory 1320 is non-transitory memory that functions to store (e.g., persistently store) data and processor-executable code (including executable code that is associated with effectuating the methods described herein). In some embodiments for example, the nonvolatile memory 1320 includes bootloader code, operating system code, file system code, and non-transitory processor-executable code to facilitate the execution of a method of biasing a substrate with the bias supply 208 described herein. The nonvolatile memory 1320 may be encoded with instructions that are executable by a processor and/or are readable by a field programmable gate array, e.g., to program the field programmable gate array wherein the instructions (when executed by the processing portion 1326 or when effectuated by the FPGA 1327) cause the bias supply 108 to carry out the methods disclosed herein. Those of ordinary skill in the art will also appreciate that the FPGA 1327 may also comprise a non-transitory medium that is integrated with the FPGA.

In many implementations, the nonvolatile memory 1320 is realized by flash memory (e.g., NAND or ONENAND memory), but it is contemplated that other memory types may be utilized as well. Although it may be possible to execute the code from the nonvolatile memory 1320, the executable code in the nonvolatile memory is typically loaded into RAM 1324 and executed by one or more of the N processing components in the processing portion 1326.

The N processing components in connection with RAM 1324 generally operate to execute the instructions stored in nonvolatile memory 1320 to enable execution of the algorithms and functions disclosed herein. It should be recognized that several algorithms are disclosed herein, but some of these algorithms are not represented in flowcharts. Processor-executable code to effectuate methods described herein may be persistently stored in nonvolatile memory 1320 and executed by the N processing components in connection with RAM 1324. As one of ordinarily skill in the art will appreciate, the processing portion 1326 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, non-transitory FPGA-configuration-instructions may be persistently stored in non-volatile memory 1320 and accessed (e.g., during boot up) to configure a field programmable gate array (FPGA) to implement the algorithms disclosed herein.

The input component 1330 may receive power related signals (e.g., signals indicative of output current, Iout, and voltage, Vout) obtained (e.g., by current transducers, VI sensors, current transducers, and/or voltage sensors) at the output node 210 and/or return node 212 of the disclosed bias supplies 208. The input component 1330 may also receive signals indicative of inductor current, Ib, and inductor voltage, Vb.

Although not required, in some implementations the FPGA 1327 may sample the power-related signals and provide the digital representations of output current, Iout, and output voltage Vout. In some embodiments, the processing components 1326 (in connection with processor-executable instructions stored in the nonvolatile memory 1320) are used to realize the data processing module, comparators, and compensators disclosed herein. But the FPGA 1327 may also be used to implement these functions. In addition, the input component 1330 may receive phase information and/or a synchronization signal between bias supplies 108 and source generator 112 that are indicative of one or more aspects of an environment within a plasma processing chamber 101 and/or synchronized control between a source generator and the single switch bias supply. The signals received at the input component 1330 may include, for example, synchronization signals, power control signals to the various generators and power supply units, or control signals from a user interface. Those of ordinary skill in the art will readily appreciate that any of a variety of types of sensors such as, without limitation, directional couplers and voltage-current (VI) sensors, may be used to sample power parameters, such as voltage and current, and that the signals indicative of the power parameters may be generated in the analog domain and converted to the digital domain.

The output component generally operates to provide one or more analog or digital signals to effectuate the gate drive signals for opening and closing of the switches. The output component may also control of the power supplies described herein.

The depicted transceiver component 1328 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

As used herein, the recitation of "at least one of A, B and C" or "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A bias supply to apply a periodic voltage comprising:
a switch network and at least one power supply, the switch network and the at least one power supply configured, in combination, to apply a periodic voltage waveform at a first node; and
a controller configured to:
receive a signal to change from a present state to a next state; and
adjust, during a transition from the present state to the next state, a voltage of the at least one power supply and simultaneously control a switching frequency of the switch network to settle at the next state after a transition wherein the controller is configured to adjust the frequency according to a predefined transition time using a predefined transition type.

2. The bias supply of claim 1, wherein the controller comprises a lookup table to access waveform timing parameter values and a corresponding number of pulse width modulated cycles for each timing parameter value.

3. The bias supply of claim 1, wherein the controller comprises a feedback control loop to adjust the frequency of the periodic voltage waveform during the transition.

4. The bias supply of claim 3, wherein the feedback control loop utilizes a bang-bang control scheme.

5. The bias supply of claim 3, wherein the feedback control loop utilizes a proportional-integral-derivative control scheme.

6. The bias supply of claim 1, wherein the controller is configured to adjust the at least one power supply and the switching frequency of the switch network according to a transition type selected from the group consisting of a linear current ramp transition, an exponentially-decaying current transition, and a concave-parabolic current transition, intentional-overshoot transition type, and intentional-undershoot transition types.

7. A method for applying a periodic voltage comprising:
applying a periodic voltage waveform;
receiving a signal to change from a present state of the periodic voltage waveform to a next state of the periodic voltage waveform; and
adjusting, during a transition from the present state to the next state, at least one portion of the periodic voltage waveform and simultaneously adjusting a frequency of the periodic voltage waveform to settle at the next state after a transition, wherein the adjusting comprises adjusting the frequency according to a predefined transition time using a predefined transition type.

8. The method of claim 7 wherein the adjusting comprises accessing a lookup table to access waveform timing parameter values and a corresponding number of pulse width modulated cycles for each timing parameter value.

9. The method of claim 7, wherein the adjusting comprises utilizing a feedback control loop to adjust the frequency.

10. The method of claim 9, wherein the feedback control loop utilizes a bang-bang control scheme.

11. The method of claim 9, wherein the feedback control loop utilizes a proportional-integral-derivative control scheme.

12. The method of claim 7, wherein the adjusting comprising adjusting the frequency according to a transition type selected from the group consisting of a linear current ramp transition, an exponentially-decaying current transition, and a concave-parabolic current transition, intentional-overshoot transition type, and intentional-undershoot transition types.

13. A non-transitory medium encoded with instructions that are executable by a processor and/or are readable by a field programmable gate array, the instructions comprising instructions to:
cause a bias supply to apply a periodic voltage waveform;
process a signal to change from a present state of the periodic voltage waveform to a next state of the periodic voltage waveform; and
cause the bias supply to adjust, during a transition from the present state to the next state, at least one portion of the periodic voltage waveform and simultaneously adjust a frequency of the periodic voltage waveform to settle at the next state, wherein the frequency during the transition is different than the frequency during either the present state or the next state.

14. The non-transitory medium of claim 13, wherein the instructions comprise instructions to:
access a lookup table to access waveform timing parameter values and a corresponding number of pulse width modulated cycles for each timing parameter value to adjust the frequency.

15. The non-transitory medium of claim 13, wherein the instructions comprise instructions to adjust the frequency of the periodic voltage waveform during the transition with a feedback control loop.

16. The non-transitory medium of claim 15, wherein the feedback control loop utilizes a bang-bang control scheme.

17. The non-transitory medium of claim 15, wherein the feedback control loop utilizes a proportional-integral-derivative control scheme.

* * * * *